(12) United States Patent
Kitamori

(10) Patent No.: US 12,250,886 B2
(45) Date of Patent: Mar. 11, 2025

(54) VIBRATION DEVICE AND IMAGING DEVICE

(71) Applicant: Murata Manufacturing Co., Ltd., Nagaokakyo (JP)

(72) Inventor: Nobumasa Kitamori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 897 days.

(21) Appl. No.: 17/356,567

(22) Filed: Jun. 24, 2021

(65) Prior Publication Data

US 2021/0320241 A1    Oct. 14, 2021

Related U.S. Application Data

(63) Continuation of application No. PCT/JP2020/024948, filed on Jun. 25, 2020.

(30) Foreign Application Priority Data

Dec. 6, 2019   (JP) .................................. 2019-221418

(51) Int. Cl.
| | |
|---|---|
| H01L 41/04 | (2006.01) |
| G03B 11/04 | (2021.01) |
| H01L 41/053 | (2006.01) |
| H10N 30/20 | (2023.01) |
| H10N 30/80 | (2023.01) |

(52) U.S. Cl.
CPC .......... *H10N 30/204* (2023.02); *G03B 11/04* (2013.01); *H10N 30/802* (2023.02); *G03B 2205/0061* (2013.01)

(58) Field of Classification Search
CPC ....... H10N 30/802; H10N 30/20; H10N 30/80
USPC ......................................................... 310/328
See application file for complete search history.

(56) References Cited

U.S. PATENT DOCUMENTS

| | | | |
|---|---|---|---|
| 2006/0028095 A1 | 2/2006 | Maruyama et al. | |
| 2016/0056367 A1* | 2/2016 | Tada | G02B 15/144 359/696 |
| 2017/0028441 A1 | 2/2017 | Kagayama et al. | |
| 2018/0210194 A1* | 7/2018 | Nishiyama | H04N 23/52 |
| 2020/0038914 A1 | 2/2020 | Fujimoto et al. | |
| 2020/0213495 A1 | 7/2020 | Fujimoto et al. | |
| 2020/0225466 A1* | 7/2020 | Sakaguchi | G03B 17/00 |

FOREIGN PATENT DOCUMENTS

| | | | |
|---|---|---|---|
| JP | 2006-048302 A | | 2/2006 |
| JP | 2009-077545 | * | 4/2009 |
| JP | 2009-077545 A | | 4/2009 |

(Continued)

OTHER PUBLICATIONS

Official Communication issued in International Patent Application No. PCT/JP2020/024948, mailed on Sep. 15, 2020.

*Primary Examiner* — Derek J Rosenau
(74) *Attorney, Agent, or Firm* — Keating & Bennett, LLP

(57) ABSTRACT

A vibration device includes a light-transmissive cover, a piezoelectric element to vibrate the light-transmissive cover, at least one vibration body connected to the piezoelectric element, at least one power feed conductor in contact with the piezoelectric element and feeding power to the piezoelectric element, and at least one elastic portion to press the at least one power feed conductor against the piezoelectric element.

18 Claims, 15 Drawing Sheets

(56) References Cited

FOREIGN PATENT DOCUMENTS

| WO | 2015/163166 A1 | 10/2015 |
| WO | 2018/198417 A1 | 11/2018 |
| WO | 2019/130623 A1 | 7/2019 |

* cited by examiner

VIBRATION DEVICE AND IMAGING DEVICE

CROSS REFERENCE TO RELATED APPLICATIONS

This application claims the benefit of priority to Japanese Patent Application No. 2019-221418 filed on Dec. 6, 2019 and is a Continuation Application of PCT Application No. PCT/JP2020/024948 filed on Jun. 25, 2020. The entire contents of each application are hereby incorporated herein by reference.

BACKGROUND OF THE INVENTION

1. Field of the Invention

The present invention relates to a vibration device and an imaging device which remove droplets by using vibration.

2. Description of the Related Art

Japanese Unexamined Patent Application Publication No. 2006-48302 discloses a piezoelectric composite device in which a piezoelectric bimorph actuator and a force detection sensor are combined. In the device described in Japanese Unexamined Patent Application Publication No. 2006-48302, a lead-out wire is soldered to a power feed electrode of a piezoelectric element.

In the device of Japanese Unexamined Patent Application Publication No. 2006-48302, there is still room for improvement in terms of increasing the reliability of the connection between the piezoelectric element and a power feed conductor.

SUMMARY OF THE INVENTION

A vibration device according to a preferred embodiment of the present invention includes a light-transmissive cover; a piezoelectric element to vibrate the light-transmissive cover; at least one vibration body connected to the piezoelectric element; at least one power feed conductor that is in contact with the piezoelectric element and feed power to the piezoelectric element; and at least one elastic portion to press the at least one power feed conductor against the piezoelectric element.

An imaging device according to a preferred embodiment of the present invention includes a vibration device according to a preferred embodiment of the present invention; and an imaging element disposed in the vibration device.

Preferred embodiments of the present invention provide vibration devices and imaging devices each achieving an increase in the reliability of connection between a piezoelectric element and a power feed conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
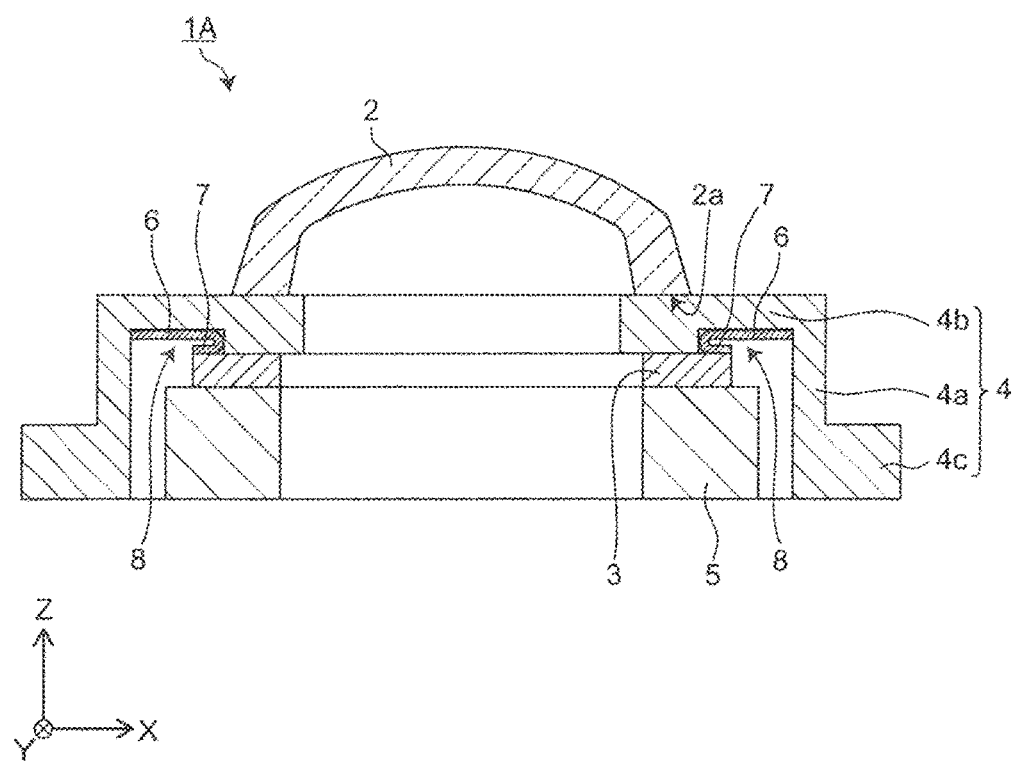
FIG. 1 is a schematic diagram of an example of a vibration device of Preferred Embodiment 1 of the present invention.

In the device described in Japanese Unexamined Patent Application Publication No. 2006-48302, a power feed conductor, which is a lead-out wire, is soldered to a power feed electrode of a piezoelectric element, thus connecting the piezoelectric element and the power feed conductor to each other. In the device described in Japanese Unexamined Patent Application Publication No. 2006-48302, the piezoelectric element is vibrated by feeding power to the piezoelectric element via the power feed conductor.

However, the piezoelectric element and the power feed conductor are connected by soldering, and the vibration of the piezoelectric element may apply stress to the connection portion of the piezoelectric element and the power feed conductor. This may cause the connection portion to be broken.

There is another method of connecting the piezoelectric element and the power feed conductor by bonding with a conductive adhesive. However, in the case that the piezoelectric element and the power feed conductor are bonded to each other with a conductive adhesive, the adhesive includes a conductive material, such as a conductive filler, for example, in order to ensure conductivity. The conductive material has no adhesion properties. For this reason, in the bonding with the conductive adhesive, it is difficult to increase the reliability of the connection between the piezoelectric element and the power feed conductor.

The inventor of preferred embodiments of the present invention have conducted extensive studies to solve the above-described problem and have discovered a configuration as follows. The power feed conductor is pressed to the piezoelectric element by an elastic portion, thus electrically connecting the power feed conductor and the piezoelectric element to each other.

A vibration device according to a preferred embodiment of the present invention includes a light-transmissive cover; a piezoelectric element to vibrate the light-transmissive cover; at least one vibration body connected to the piezoelectric element; at least one power feed conductor in contact with the piezoelectric element and feed power to the piezoelectric element; and at least one elastic portion to press the at least one power feed conductor against the piezoelectric element.

With this configuration, the reliability of the connection between the piezoelectric element and the power feed conductor is increased.

The at least one elastic portion is provided by bending the at least one power feed conductor, and may have a plate spring shape provided by curving the at least one power feed conductor.

With this configuration, the power feed conductor is pressed against the piezoelectric element, and the reliability of the connection between the piezoelectric element and the power feed conductor is increased.

A contact region of the at least one power feed conductor and the piezoelectric element may be smaller than a connection region of the at least one vibration body and the piezoelectric element.

With this configuration, the reliability of the connection between the piezoelectric element and the power feed conductor is increased while reducing or preventing the reduction in vibration of the piezoelectric element.

The piezoelectric element includes a first surface and a second surface on a side opposite to the first surface, the vibration body is connected to the light-transmissive cover and the first surface of the piezoelectric element, the power feed conductor is in contact with the first surface of the piezoelectric element, the at least one elastic portion presses the power feed conductor against the first surface of the piezoelectric element, and in the first surface of the piezoelectric element, the occupation ratio of the connection region may be about 70% or more and the occupation ratio of the contact region may be about 30% or less, for example.

With this configuration, the reliability of the connection between the piezoelectric element and the power feed conductor may be further increased while further reducing or preventing the reduction in vibration of the piezoelectric element.

The piezoelectric element includes at least one electrode, the at least one vibration body includes at least one groove exposing the at least one electrode, and the at least one elastic portion may be disposed in the at least one groove.

With this configuration, the power feed conductor may easily be pressed to the piezoelectric element, and the reliability of the connection between the piezoelectric element and the power feed conductor is increased.

The at least one power feed conductor includes an annular portion, and a plurality of the elastic portions may be disposed at equal or substantially equal intervals in the annular portion.

With this configuration, the power feed conductor may be brought into contact with the piezoelectric element in a well-balanced manner, and the reliability of the connection between the piezoelectric element and the power feed conductor may be further increased.

The piezoelectric element includes a first surface and a second surface on a side opposite to the first surface, the at least one power feed conductor includes a first power feed conductor in contact with the first surface and a second power feed conductor in contact with the second surface, and the at least one elastic portion may include at least one first elastic portion to press the first power feed conductor to the first surface and at least one second elastic portion to press the second power feed conductor to the second surface.

With this configuration, the reliability of the connection between the piezoelectric element and the power feed conductor may be further increased.

The piezoelectric element has an annular shape, the at least one vibration body includes a first vibration body connected to a bottom surface of the light-transmissive cover and the first surface of the piezoelectric element and a second vibration body connected to the second surface of the piezoelectric element, and the second power feed conductor may be in contact with the piezoelectric element on an inner peripheral side of the piezoelectric element relative to the first power feed conductor.

With this configuration, the reliability of the connection between the piezoelectric element and the power feed conductor may be further increased.

In the first surface of the piezoelectric element, a contact region of the first power feed conductor and the piezoelectric element may be smaller than a connection region of the first vibration body and the piezoelectric element, and in the second surface of the piezoelectric element, a contact region of the second power feed conductor and the piezoelectric element may be smaller than a connection region of the second vibration body and the piezoelectric element.

With this configuration, the reliability of the connection between the piezoelectric element and the power feed conductor is increased while further reducing or preventing the reduction in vibration of the piezoelectric element.

The piezoelectric element includes a first electrode provided on the first surface and a second electrode provided on the second surface, the first vibration body includes at least one first groove exposing the first electrode, the second vibration body includes at least one second groove exposing the second electrode, the at least one first elastic portion may be disposed in the at least one first groove, and the at least one second elastic portion may be disposed in the at least one second groove.

With this configuration, the reliability of the connection between the piezoelectric element and the power feed conductor is further increased.

The first power feed conductor may include at least one first support portion extending in a direction intersecting a thickness direction of the piezoelectric element, and the piezoelectric element may be held between the at least one first elastic portion and the at least one first support portion.

With this configuration, the piezoelectric element is sandwiched and supported by the first power feed conductor, and the reliability of the connection between the piezoelectric element and the first power feed conductor may be further increased.

The second power feed conductor may include at least one second support portion extending in the direction intersecting the thickness direction of the piezoelectric element, and the piezoelectric element may be held between the at least one second elastic portion and the at least one second support portion.

With this configuration, the piezoelectric element is sandwiched and supported by the second power feed conductor, and the reliability of the connection between the piezoelectric element and the second power feed conductor may be further increased.

A plurality of the second elastic portions may be disposed between a plurality of the first elastic portions.

With this configuration, the reliability of the connection between the piezoelectric element and the power feed conductor is further increased.

The at least one first elastic portion and the at least one second elastic portion may be opposed to each other in the thickness direction of the piezoelectric element.

With this configuration, the piezoelectric element is sandwiched and supported by the first elastic portion and the second elastic portion, and the reliability of the connection between the piezoelectric element and the second power feed conductor is further increased.

The at least one vibration body may be made of metal, and the at least one vibration body may be covered with an insulation material.

With this configuration, the reliability of the connection between the piezoelectric element and the power feed conductor is increased while reducing the manufacturing cost.

An imaging device according to a preferred embodiment of the present invention includes a vibration device according to a preferred embodiment of the present invention; and an imaging element disposed in the vibration device.

With this configuration, the reliability of the connection between the piezoelectric element and the power feed conductor is increased.

Hereinafter, preferred embodiments of the present invention will be described with reference to the accompanying drawings. The following description is merely exemplary in nature, and is not intended to limit the present invention, the application thereof, or the use thereof. Further, the drawings are schematic, and the proportions and the like of the respective dimensions do not necessarily coincide with the actual ones.

Preferred Embodiment 1

Overall Configuration

Figure 2:
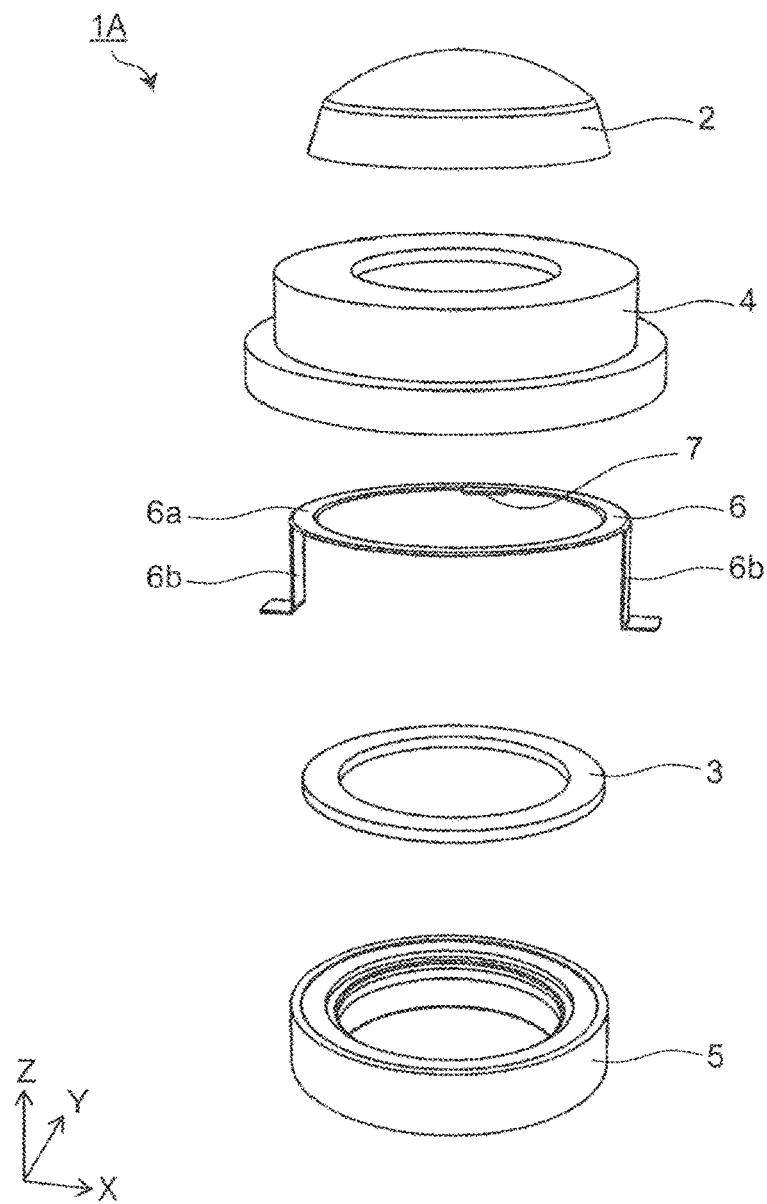
FIG. 2 is an exploded perspective view of the vibration device of Preferred Embodiment 1 of the present invention.
Figure 3:
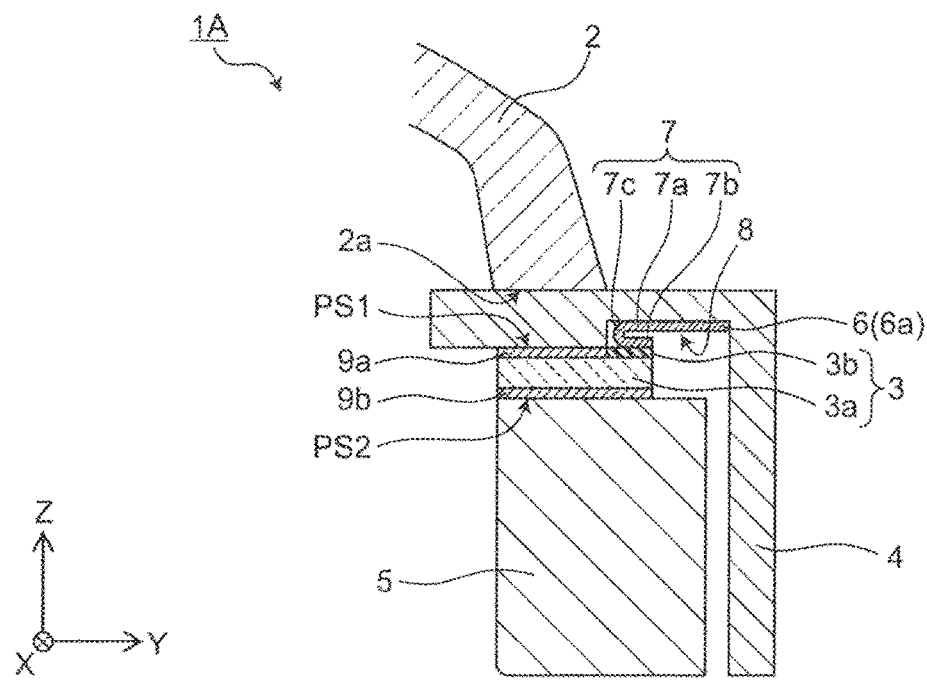
FIG. 3 is a partial enlarged view of an example of the vibration device of Preferred Embodiment 1 of the present invention.
Figure 4:
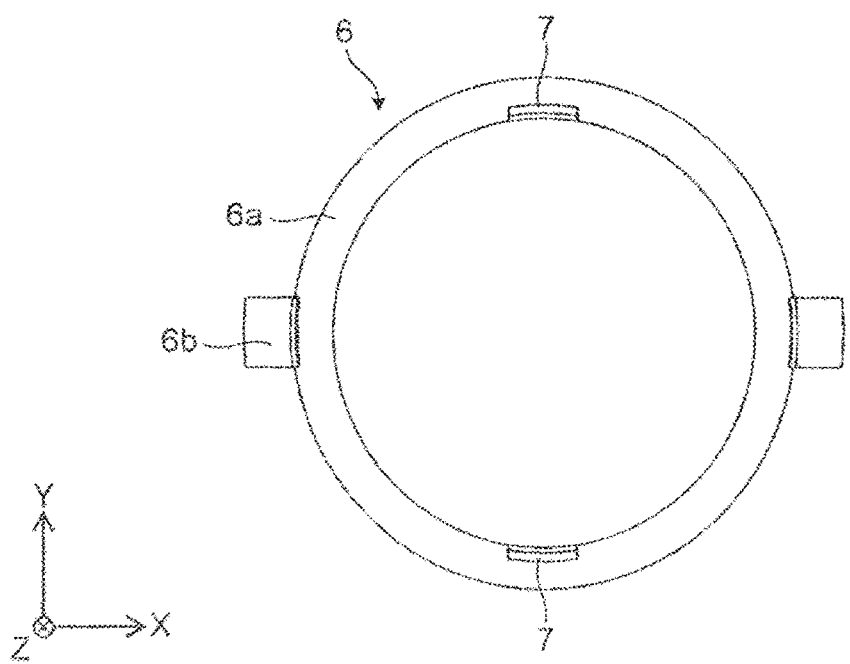
FIG. 4 is a schematic diagram viewed from below of an example of a power feed conductor of Preferred Embodiment 1 of the present invention.

FIG. 1 is a schematic diagram of an example of a vibration device 1A of Preferred Embodiment 1 of the present invention. FIG. 2 is an exploded perspective view of an example of the vibration device 1A of Preferred Embodiment 1 of the present invention. FIG. 3 is a partial enlarged view of an example of the vibration device 1A of Preferred Embodiment 1 of the present invention. FIG. 4 is a schematic diagram viewed from below of an example of a power feed conductor 6 of Preferred Embodiment 1 of the present invention. Note that X, Y, and Z directions in the drawings indicate a longitudinal direction, a horizontal direction, and a height direction of the vibration device 1A, respectively.

As illustrated in FIG. 1 to FIG. 4, the vibration device 1A includes a light-transmissive cover 2, a piezoelectric element 3, a plurality of vibration bodies 4 and 5, and the power feed conductor 6. A plurality of elastic portions 7 are provided on the power feed conductor 6 in the vibration device 1A. In Preferred Embodiment 1, the plurality of vibration bodies 4 and 5 include a first vibration body 4 and a second vibration body 5. Two elastic portions 7 are provided on the power feed conductor 6. Note that the vibration device 1A may include a power supply circuit to supply electric power to the power feed conductor 6, and a controller configured or programmed to control the power supply circuit.

In the vibration device 1A, droplets adhered to the light-transmissive cover 2 are atomized and removed by vibrating the light-transmissive cover 2. Further, in the vibration device 1A, foreign matter or the like adhered to the light-transmissive cover 2 is moved by vibrating the light-transmissive cover 2. For example, the vibration device 1A removes the droplets and/or the foreign matter adhered to the light-transmissive cover 2 from the inside of the field of view of the imaging element disposed in an internal space. Note that the foreign matter includes sand, stone, and/or dust, for example.

The internal space is defined by the light-transmissive cover 2, the piezoelectric element 3, the plurality of vibration bodies 4 and 5, and the power feed conductor 6. An optical detection element, such as the imaging element, for example, is disposed in the internal space. Note that the internal space is not limited to a sealed space. The internal space includes a space of which a portion is open to the outside.

Hereinafter, the configuration of the vibration device 1A will be described in detail.

Light-Transmissive Cover

The light-transmissive cover 2 forms an exterior of the vibration device 1A. The light-transmissive cover 2 has a light-transmissive property which enables an energy ray or light having a wavelength detected by an optical detection element, such as an imaging element, for example, to pass the light-transmissive cover 2.

The material of the light-transmissive cover 2 includes light-transmissive plastic, glass such as quartz or borosilicate, or light-transmissive ceramic, for example.

The light-transmissive cover 2 has a dome shape. The light-transmissive cover 2 has a circular shape in plan view. The light-transmissive cover 2 is connected to the first vibration body 4. Specifically, the light-transmissive cover 2 includes a bottom surface 2a. The bottom surface 2a is connected to an upper surface of the first vibration body 4. Note that the shape of the light-transmissive cover 2 is not limited thereto. For example, the light-transmissive cover 2 may have a flat plate shape. The light-transmissive cover 2 in plan view may have a shape such as a polygonal shape, an elliptical shape, or a triangular shape, for example. In the present description, a plan view refers to a direction viewed in the Z direction.

Piezoelectric Element

The piezoelectric element 3 vibrates the light-transmissive cover 2. The piezoelectric element 3 is connected to the plurality of vibration bodies 4 and 5. Further, the piezoelectric element 3 is connected to the power feed conductor 6. For example, the piezoelectric element 3 is connected to the power feed conductor 6 via the plurality of elastic portions 7. The piezoelectric element 3 vibrates with the power fed from the power feed conductor 6.

The piezoelectric element 3 includes a first surface PS1 and a second surface PS2 on the side opposite to the first surface PS1. Specifically, the piezoelectric element 3 has a plate shape, and the first surface PS1 and the second surface PS2 are opposed to each other in the Z direction. The first vibration body 4 is disposed to the piezoelectric element 3 on a side of the first surface PS1. The second vibration body 5 is disposed to the piezoelectric element 3 on a side of the second surface PS2.

The piezoelectric element 3 includes a piezoelectric body 3a and an electrode 3b provided on the side of the first surface PS1.

The material of the piezoelectric body 3a includes appropriate piezoelectric ceramics such as PZT, $KNbO_3$, or $NaNbO_3$ or appropriate piezoelectric single crystal such as $LiTaO_3$ or $LiNbO_3$, for example. The piezoelectric body 3a has an annular shape, for example. Note that the shape of the piezoelectric body 3a is not limited thereto.

The electrode 3b has an annular shape, for example. The electrode 3b is provided on an outer peripheral side of the first surface PS1 of the piezoelectric element 3. The electrode 3b may be a Ni electrode, for example. Alternatively, the electrode 3b may be an electrode made of a metal thin film, such as, for example, Ag or Au, which is formed with a sputtering method. The electrode 3b is connected to the power feed conductor 6. The electrode may be formed with, for example, plating or vapor deposition in addition to the sputtering.

Vibration Bodies

The plurality of vibration bodies 4 and 5 are connected to the piezoelectric element 3, and amplify the vibration of the piezoelectric element 3. The first vibration body 4 is disposed between the light-transmissive cover 2 and the piezoelectric element 3. The second vibration body 5 is disposed on the piezoelectric element 3 on the side of the second surface PS2.

The first vibration body 4 is connected to the bottom surface 2a of the light-transmissive cover 2 and the first surface PS1 of the piezoelectric element 3. Specifically, the first vibration body 4 is connected to the first surface PS1 of the piezoelectric element 3 via a connection region 9a. The first vibration body 4 is bonded by an adhesive applied to the connection region 9a, for example.

The first vibration body 4 has a cylindrical shape. The first vibration body 4 has a cylindrical shape extending in the Z direction. Specifically, the first vibration body 4 includes a tubular body 4a, a top plate 4b protruding toward the center of the tubular body 4a on an upper surface side of the tubular body 4a, and a flange portion 4c protruding toward the outer peripheral side on a lower surface side of the tubular body 4a.

The top plate 4b is an annular plate. Further, a groove 8 in which the power feed conductor 6 is disposed is provided on the lower surface of the top plate 4b. The groove 8 is recessed in an annular shape. Specifically, the groove 8 is recessed in the thickness direction (Z direction) of the top plate 4b. The depth of the groove 8 is larger than the thickness of the power feed conductor 6.

The groove 8 exposes a portion of the first surface PS1 of the piezoelectric element 3. The groove 8 exposes the electrode 3b provided on the piezoelectric element 3 on the side of the first surface PS1 from the first vibration body 4.

The second vibration body 5 is connected to the second surface PS2 of the piezoelectric element 3. Specifically, the second vibration body 5 is connected to the second surface PS2 of the piezoelectric element 3 via a connection region 9b. The second vibration body 5 is bonded by an adhesive applied to the connection region 9b, for example.

The second vibration body 5 has a cylindrical shape. Specifically, an outer diameter of the second vibration body 5 is smaller than an inner diameter of the tubular body 4a of the first vibration body 4. The second vibration body 5 is disposed inside the first vibration body 4.

The material of the first vibration body 4 and the second vibration body 5 is metal, glass, or ceramic, for example.

In Preferred Embodiment 1, the first vibration body 4 and the second vibration body 5 are made of metal. Further, the first vibration body 4 and the second vibration body 5 are covered with an insulation material.

Power Feed Conductor

The power feed conductor 6 is in contact with the piezoelectric element 3, and feeds power to the piezoelectric element 3. The power feed conductor 6 is in contact with the piezoelectric element 3 on the side of the first surface PS1.

The power feed conductor 6 includes an annular portion 6a and a plurality of guides 6b.

The annular portion 6a has an annular shape. Further, the annular portion 6a is plate-shaped. The annular portion 6a is disposed in the groove 8 of the first vibration body 4.

The plurality of guides 6b are plate-shaped bodies that extend from the annular portion 6a. The plurality of guides 6b extend along an inner periphery of the tubular body 4a of the first vibration body 4 in the Z direction, and extend toward an outer peripheral side of the first vibration body 4. In other words, the plurality of guides 6b extend along the inner periphery of the tubular body 4a of the first vibration body 4, and are bent toward a side of the flange portion 4c on the lower surface of the tubular body 4a.

In Preferred Embodiment 1, two guides 6b are provided on the annular portion 6a. The two guides 6b are opposed to each other in the X direction in the annular portion 6a.

The power feed conductor 6 is made of a material having conductivity. The material of the power feed conductor 6 is metal such as stainless steel, beryllium copper, nickel silver, or copper, for example. Alternatively, the power feed conductor 6 may have a configuration in which the conductivity is provided a surface of an insulation material with, for example, metal plating.

The power feed conductor 6 is connected to the power supply circuit, for example. The power supply circuit supplies electric power to the power feed conductor. The power supply circuit includes semiconductor elements, for example. The power supply circuit is controlled by the controller, for example. The controller includes a memory stored a program and a processing circuit corresponding to a processor such as a central processing unit (CPU), for example. In the controller, the processor executes the program stored in the memory, for example.

Elastic Portions

The plurality of elastic portions 7 press the power feed conductor 6 against the piezoelectric element 3. Specifically, the plurality of elastic portions 7 press the power feed conductor 6 against the electrode 3b provided on the first surface PS1 of the piezoelectric element 3.

"To press the power feed conductor 6 against the piezoelectric element 3" includes the following. A portion of the power feed conductor 6 is formed as the elastic portion 7, and the elastic portion 7 is brought into contact with the piezoelectric element 3. Further, "to press the power feed conductor 6 against the piezoelectric element 3" includes the following. The elastic portion 7 is a separate body from the power feed conductor 6, and the power feed conductor 6 is pressed against the piezoelectric element 3 by the elastic portion 7, and is brought into contact with the piezoelectric element 3.

In Preferred Embodiment 1, the plurality of elastic portions 7 are portions of the power feed conductor 6. The plurality of elastic portions 7 are in contact with the electrode 3b of the piezoelectric element 3 while applying force thereto. This makes the power feed conductor 6 and the electrode 3b of the piezoelectric element 3 be electrically connected with each other.

Referring back to FIG. 3, the elastic portion 7 is a portion provided by bending the power feed conductor 6, and has a plate spring shape provided by curving the power feed conductor 6. Specifically, the elastic portion 7 is provided by curving a plate structure, which protrudes from the annular portion 6a of the power feed conductor 6 toward the center, in a U-shape, for example.

The elastic portion 7 is a plate-shaped structure having a thickness of about 0.2 mm, for example. The elastic portion 7 preferably is made of the same material as that of the power feed conductor 6. The material of the elastic portion 7 is metal such as stainless steel, beryllium copper, nickel silver, or copper, for example. Alternatively, the elastic portion 7 may have a configuration in which the metal is exposed only at the connection point.

Specifically, the elastic portion 7 includes a first plate-shaped portion 7a, a second plate-shaped portion 7b facing the first plate-shaped portion 7a with a space therebetween, and a curved portion 7c connecting the first plate-shaped portion 7a and the second plate-shaped portion 7b.

The first plate-shaped portion 7a extends in the Y direction. The second plate-shaped portion 7b faces the first plate-shaped portion 7a with a space therebetween in the Z direction, and extends in the Y direction. Further, the second plate-shaped portion 7b is in contact with the electrode 3b of the piezoelectric element 3. The curved portion 7c is provided by curving a plate. For example, the curved portion 7c is provided by curving the plate in a U-shape in the Y direction. One end of the curved portion 7c is connected to the first plate-shaped portion 7a. The other end of the curved portion 7c is connected to the second plate-shaped portion 7b.

The first plate-shaped portion 7a is supported by the recessed surface of the groove 8 of the first vibration body 4. The second plate-shaped portion 7b is in contact with the electrode 3b of the piezoelectric element 3. The curved portion 7c presses the second plate-shaped portion 7b against the electrode 3b of the piezoelectric element 3. For example, the curved portion 7c applies force to the second plate-shaped portion 7b in a direction away from the first plate-shaped portion 7a in the height direction (Z direction) of the vibration device 1A. With this, the curved portion 7c is able to apply force in a direction in which the space between the first plate-shaped portion 7a and the second plate-shaped portion 7b is widened. As a result, the second plate-shaped portion 7b is pressed against the electrode 3b of the piezoelectric element 3.

As described above, the elastic portion 7 is a portion of the power feed conductor 6, and presses the power feed conductor 6 against the electrode 3b of the piezoelectric element 3. With this, even when the piezoelectric element 3 vibrates, the breakage of the electrical connection between the power feed conductor 6 and the electrode 3b of the piezoelectric element 3 may be reduced or prevented.

In Preferred Embodiment 1, two elastic portions 7 are opposed to each other in the Y direction in the annular portion 6a. Further, the two elastic portions 7 are provided between the two guides 6b.

Note that the shape, number, and arrangement positions of the elastic portions 7 are not limited thereto. The elastic portion 7 may have various shapes, numbers, and arrangements which will be described later. Further, an example has been described in which the elastic portion 7 is a portion of the power feed conductor 6, but the present invention is not limited thereto. The elastic portion 7 may be a separate body from the power feed conductor 6.

Next, the relationship between the connection region 9a of the first vibration body 4 and the contact region of the power feed conductor 6 on the first surface PS1 of the piezoelectric element 3 will be described. Note that the connection region 9a of the first vibration body 4 is a region in which the first vibration body 4 and the piezoelectric element 3 are bonded by an adhesive. The contact region of the power feed conductor 6 is a region in which the electrode 3b of the piezoelectric element 3 is provided. Note that an electrode may or may not be provided in the connection region 9a.

Figure 5:
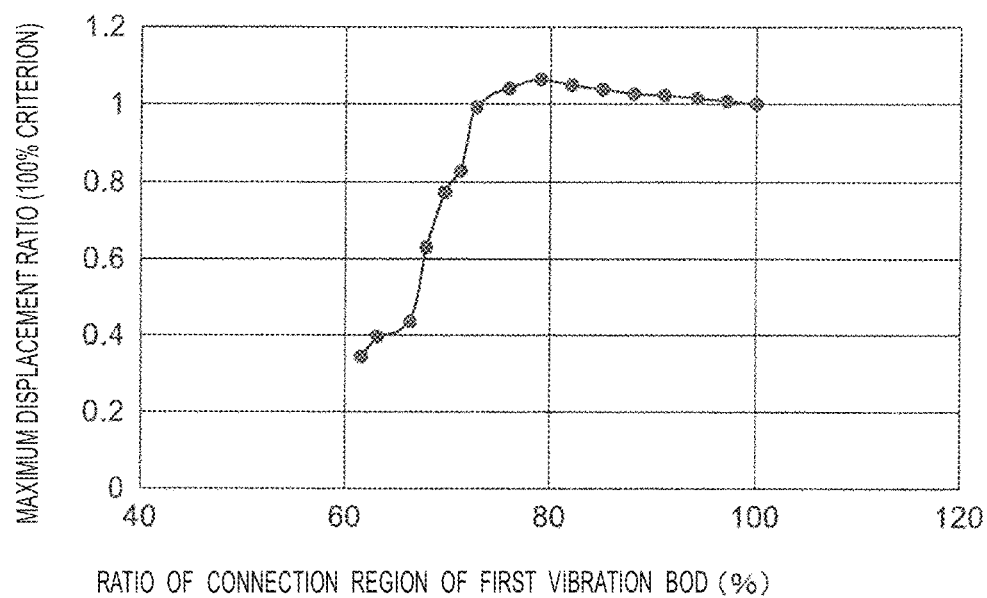
FIG. 5 is a graph illustrating an example of a relationship between a ratio of adhesion area of a first vibration body to a first surface of a piezoelectric element and a maximum displacement ratio.

FIG. 5 is a graph illustrating an example of a relationship between the ratio of the connection region 9a of the first vibration body 4 to the first surface PS1 of the piezoelectric element 3 and the maximum displacement ratio. Note that the ratio of the connection region 9a of the first vibration body 4 to the first surface PS1 of the piezoelectric element 3 refers to an occupation ratio of the area of the connection region 9a to the area of the first surface PS1 of the piezoelectric element 3. For example, in the case that the ratio of the connection region of the first vibration body 4 is about 80%, the contact region of the power feed conductor 6 is about 20%. The maximum displacement ratio refers to the ratio of a maximum displacement calculated with the 100% displacement as a criterion. The larger maximum displacement ratio means the greater vibration.

As illustrated in FIG. 5, on the first surface PS1 of the piezoelectric element 3, the contact region of the power feed conductor 6 and the piezoelectric element 3 is smaller than the connection region 9a of the first vibration body 4 and the piezoelectric element 3. In other words, on the first surface PS1 of the piezoelectric element 3, the region in which the electrode 3b is provided is smaller than the connection region 9a of the first vibration body 4 and the piezoelectric element 3.

Specifically, on the first surface PS1 of the piezoelectric element 3, the occupation ratio of the connection region 9a of the first vibration body 4 is preferably about 70% or more, for example. This makes it possible to maintain the maximum displacement ratio at about 0.8 or more, for example. Alternatively, the occupation ratio of the connection region 9a of the first vibration body 4 is preferably about 75% or more, for example. This makes it possible to maintain the maximum displacement ratio at about 1 or more, for example. Further, in order to secure the region to provide the electrode 3*b* in the first surface PS1 of the piezoelectric element 3, the occupation ratio of the connection region 9*a* of the first vibration body 4 is preferably about 95% or less, for example.

As described above, on the first surface PS1 of the piezoelectric element 3, the occupation ratio of the connection region 9*a* of the first vibration body 4 is preferably about 70% or more, for example. More preferably, the occupation ratio of the connection region 9*a* of the first vibration body 4 is about 75%, for example. On the first surface PS1 of the piezoelectric element 3, the occupation ratio of the contact region of the power feed conductor 6 is preferably about 30% or less, for example. More preferably, the occupation ratio of the contact region of the power feed conductor 6 is about 25% or less, for example.

Operation

Next, an example of an operation of the vibration device 1A will be described.

In the vibration device 1A, the controller supplies electric power to the power feed conductor 6 by controlling the power supply circuit. With this, the power supply circuit feeds power to the piezoelectric element 3 via the power feed conductor 6.

The piezoelectric element 3 vibrates with the power fed from the power supply circuit. The vibration of the piezoelectric element 3 is amplified by the first vibration body 4 and the second vibration body 5. The vibration device 1A vibrates the light-transmissive cover 2 with the vibration of the piezoelectric element 3, and removes the droplets and/or the foreign matter adhered to the light-transmissive cover 2.

In the vibration device 1A, the power feed conductor 6 is pressed against the electrode 3*b* of the piezoelectric element 3 by the plurality of elastic portions 7. With this, the breakage of the connection between the power feed conductor 6 and the electrode 3*b* of the piezoelectric element 3 is reduced or prevented.

Advantageous Effects

With the use of the vibration device 1A according to Preferred Embodiment 1, the following advantageous effects may be obtained.

The vibration device 1A includes the light-transmissive cover 2, the piezoelectric element 3, the plurality of vibration bodies 4 and 5, the power feed conductor 6, and the plurality of elastic portions 7. The piezoelectric element 3 vibrates the light-transmissive cover 2. The plurality of vibration bodies 4 and 5 are connected to the piezoelectric element 3. The power feed conductor 6 is in contact with the piezoelectric element 3, and feeds power to the piezoelectric element 3. The plurality of elastic portions 7 press the power feed conductor 6 against the piezoelectric element 3. With this configuration, the reliability of the connection between the piezoelectric element 3 and the power feed conductor 6 is increased.

The plurality of elastic portions 7 are provided by bending the power feed conductor 6, and have a plate spring shape provided by curving the power feed conductor 6. With this configuration, the power feed conductor 6 may easily be pressed against the piezoelectric element 3, and the reliability of the connection between the piezoelectric element 3 and the power feed conductor 6 is increased. Further, the plurality of elastic portions 7 may be defined by a portion of the power feed conductor 6, and the manufacturing cost may be reduced as compared with the case that an elastic body is provided as a separate body.

The contact region of the power feed conductor 6 and the piezoelectric element 3 is smaller than the connection region 9*a* of the first vibration body 4 and the piezoelectric element 3. With this configuration, the reliability of the connection between the piezoelectric element 3 and the power feed conductor 6 is increased while reducing or preventing the attenuation of the vibration due to the plurality of elastic portions 7.

The piezoelectric element 3 includes the first surface PS1 and the second surface PS2 on the side opposite to the first surface PS1. The first vibration body 4 is connected to the light-transmissive cover 2 and the first surface PS1 of the piezoelectric element 3. The power feed conductor 6 is in contact with the first surface PS1 of the piezoelectric element 3. The plurality of elastic portions 7 press the power feed conductor 6 against the first surface PS1 of the piezoelectric element 3. On the first surface PS1 of the piezoelectric element 3, the occupation ratio of the connection region 9*a* of the first vibration body 4 is preferably about 70% or more, and the occupation ratio of the contact region of the power feed conductor 6 is preferably about 30% or less, for example. With this configuration, the reliability of the connection between the piezoelectric element 3 and the power feed conductor 6 is increased while further reducing or preventing the attenuation of the vibration due to the plurality of elastic portions 7.

The piezoelectric element 3 includes the electrode 3*b*. The first vibration body 4 includes the groove 8 exposing the electrode 3*b*. The plurality of elastic portions 7 are disposed in the groove 8. With this configuration, the power feed conductor 6 may easily be pressed by the plurality of elastic portions 7. Pressing the power feed conductor 6 against the electrode 3*b* by the plurality of elastic portions 7 in the groove 8 to bring the power feed conductor 6 into contact with the electrode 3*b* makes the separation of the power feed conductor 6 from the piezoelectric element 3 be easily reduced or prevented. With this, the reliability of the connection between the piezoelectric element 3 and the power feed conductor 6 may be further increased.

The plurality of vibration bodies 4 and 5 are made of metal. The plurality of vibration bodies 4 and 5 are covered with an insulation material. With this configuration, manufacturing the plurality of vibration bodies 4 and 5 at low cost may be possible, and in addition to that, electrical safety may be maintained.

Note that, an example has been described in which the vibration device 1A includes one annular piezoelectric element 3 in Preferred Embodiment 1, but the present invention is not limited thereto. For example, the vibration device 1A may include a plurality of piezoelectric elements having a rectangular shape, a circular shape, a polygonal shape, or an elliptical shape. In this case, the plurality of piezoelectric elements may be disposed in an annular shape, for example. Alternatively, the plurality of piezoelectric elements may be disposed in accordance with the shape of the light-transmissive cover 2.

An example has been described in which the vibration device 1A includes the plurality of vibration bodies 4 and 5 in Preferred Embodiment 1, but the present invention is not limited thereto. The vibration device 1A may include one or a plurality of vibration bodies. For example, the vibration device 1A may include one vibration body connected to the light-transmissive cover 2 and the piezoelectric element 3.

An example has been described in which the vibration device 1A includes one power feed conductor 6 in Preferred Embodiment 1, but the present invention is not limited thereto. The vibration device 1A may include one or a plurality of power feed conductors.

An example has been described in which the vibration device 1A includes the plurality of elastic portions 7 in Preferred Embodiment 1, but the present invention is not limited thereto. The vibration device 1A may include one or a plurality of elastic portions 7.

An example has been described in which the electrode 3b is provided on the outer peripheral side on the first surface PS1 of the piezoelectric element 3 in Preferred Embodiment 1, but the present invention is not limited thereto. The electrode 3b may be provided at a position where the piezoelectric element 3 and the power feed conductor 6 are in contact with each other. For example, the electrode 3b may be provided on the inner peripheral side on the first surface PS1 of the piezoelectric element 3. Alternatively, the electrode 3b may be provided on the second surface PS2 of the piezoelectric element 3.

An example has been described in which the electrode 3b has an annular shape in Preferred Embodiment 1, but the present invention is not limited thereto. The electrode 3b may be provided on a portion in contact with the power feed conductor 6. For example, a plurality of electrodes 3b having a rectangular shape may be provided on the first surface PS1 of the piezoelectric element 3.

An example has been described in which the power feed conductor 6 is in contact with the piezoelectric element 3 on the side of the first surface PS1 in Preferred Embodiment 1, but the present invention is not limited thereto. For example, the power feed conductor 6 may be in contact with the piezoelectric element 3 on the side of the second surface PS2. In this case, the electrode 3b may be provided on the piezoelectric element 3 on the side of the second surface PS2.

An example has been described in which the groove 8 provided on the first vibration body 4 has an annular shape in Preferred Embodiment 1, but the present invention is not limited thereto. In the first vibration body 4, one or a plurality of grooves 8 including a space in which the plurality of elastic portions 7 are disposed may be provided. The one or plurality of grooves 8 may expose the electrode 3b from the first vibration body 4.

An example has been described in which the plurality of elastic portions 7 are opposed to each other in the Y direction on the annular portion 6a of the power feed conductor 6 in Preferred Embodiment 1, but the present invention is not limited thereto. The plurality of elastic portions 7 may be randomly disposed on the annular portion 6a of the power feed conductor 6.

An example has been described in which the elastic portion 7 is provided by bending the power feed conductor 6 and has a plate spring shape provided by curving the power feed conductor 6 in a U-shape in Preferred Embodiment 1, but the present invention is not limited thereto. The elastic portion 7 may have a shape to press the power feed conductor 6 against the piezoelectric element 3 and to bring the power feed conductor 6 into contact with the piezoelectric element 3. For example, the elastic portion 7 may be provided by bending the power feed conductor 6 in a coil shape. The elastic portion 7 may have a V-shape, a W-shape, or the like, for example.

FIGS. 6A to 6D are partial enlarged views a vibration device of a modification of Preferred Embodiment 1 of the present invention.

Figure 6A:
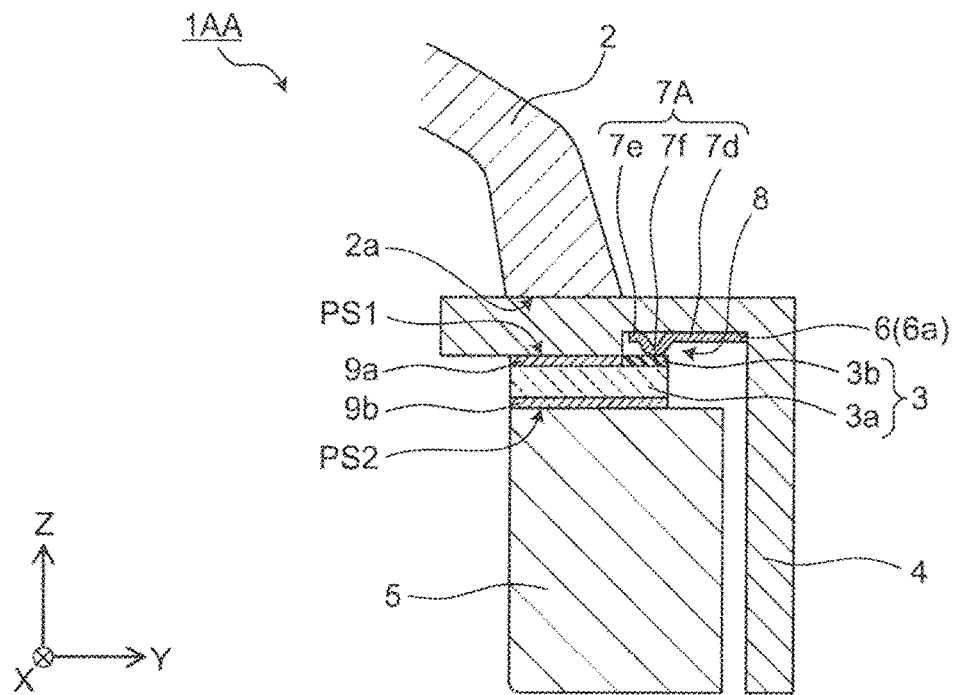
FIG. 6A is a partial enlarged view of a vibration device of a modification of Preferred Embodiment 1 of the present invention.

In a vibration device 1AA illustrated in FIG. 6A, an elastic portion 7A is provided by bending the power feed conductor 6, and has a plate spring shape provided by curving the power feed conductor 6. The elastic portion 7A includes a third plate-shaped portion 7d, a fourth plate-shaped portion 7e disposed with a space between the third plate-shaped portion 7d and the fourth plate-shaped portion 7e, and a curved portion 7f connecting the third plate-shaped portion 7d and the fourth plate-shaped portion 7e.

The third plate-shaped portion 7d extends in the Y direction. The fourth plate-shaped portion 7e extends in the Y direction at the same or substantially the same height as the third plate-shaped portion 7d. The third plate-shaped portion 7d and the fourth plate-shaped portion 7e are disposed with a space therebetween. The curved portion 7f is provided by curving the plate-shaped structure in a U-shape in the Z direction. One end of the curved portion 7f is connected to an end portion of the third plate-shaped portion 7d. The other end of the curved portion 7f is connected to an end portion of the fourth plate-shaped portion 7e. The curved portion 7f is in contact with the electrode 3b of the piezoelectric element 3.

The curved portion 7f is in contact with the electrode 3b of the piezoelectric element 3 while applying force in a direction in which the space between the third plate-shaped portion 7d and the fourth plate-shaped portion 7e is narrowed. With this, the power feed conductor 6 and the electrode 3b of the piezoelectric element 3 are electrically connected.

Figure 6B:
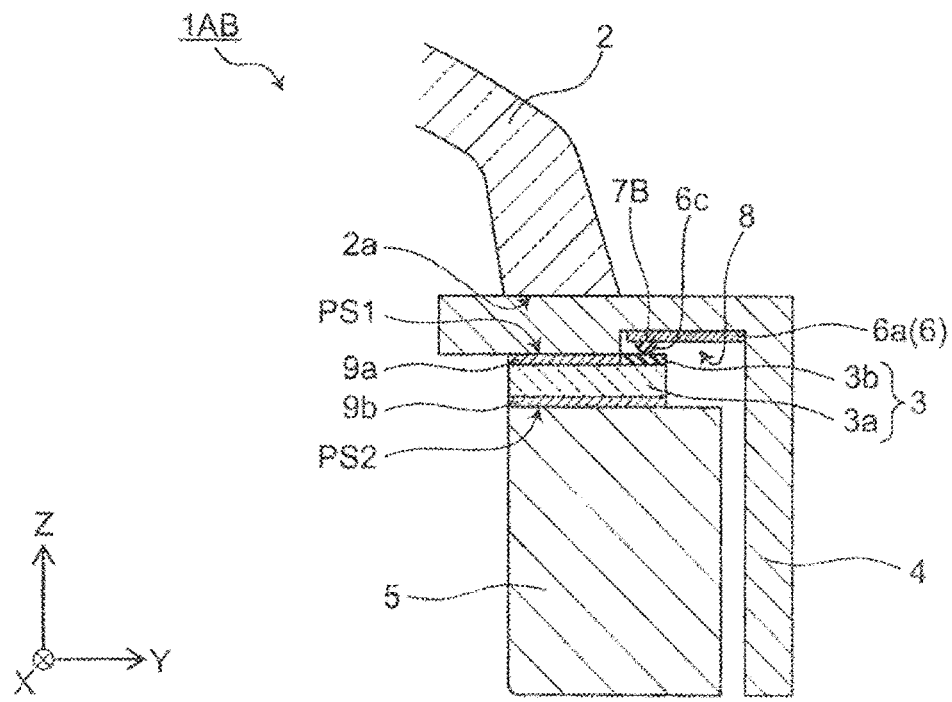
FIG. 6B is a partial enlarged view of a vibration device of a modification of Preferred Embodiment 1 of the present invention.

In a vibration device 1AB illustrated in FIG. 6B, an elastic portion 7B is defined by a portion of the power feed conductor 6, and is a plate-shaped structure extending in the Y direction from the inner periphery of the annular portion 6a. The vibration device 1AB includes a projection 6c protruding from the elastic portion 7B toward a side of the piezoelectric element 3. The projection 6c is made of an elastic material having conductivity. The projection 6c may be formed by, for example, depositing, sputtering, or plating a metal body. The projection 6c has a hemispherical shape, for example. The projection 6c is disposed between the elastic portion 7B and the electrode 3b of the piezoelectric element 3 in the groove 8. With this, the power feed conductor 6 and the piezoelectric element 3 are electrically connected. Note that a conductive sheet may be disposed between the projection 6c and the electrode 3b of the piezoelectric element 3.

Figure 6C:
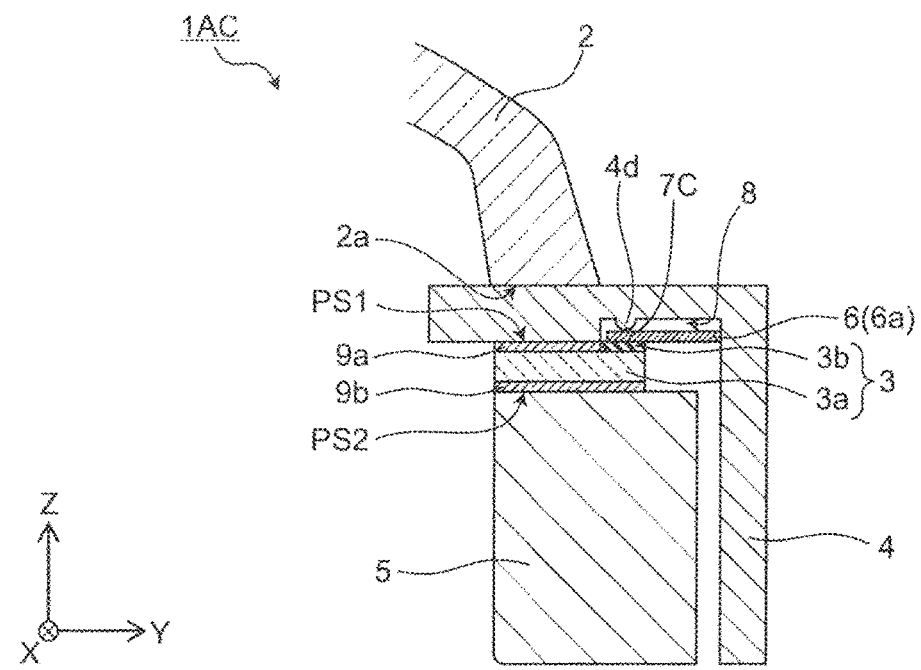
FIG. 6C is a partial enlarged view of a vibration device of a modification of Preferred Embodiment 1 of the present invention.

In a vibration device 1AC illustrated in FIG. 6C, an elastic portion 7C is defined by a portion of the power feed conductor 6, and is a plate-shaped structure extending in the Y direction from the inner periphery of the annular portion 6a. The vibration device 1AC includes a projection 4d protruding from a wall surface defining the groove 8 provided on the first vibration body 4. The projection 4d has a hemispherical shape, for example. The projection 4d is disposed between the recessed surface of the groove 8 and the elastic portion 7C. With this, the elastic portion 7C is pressed against the electrode 3b of the piezoelectric element 3, and the power feed conductor 6 and the piezoelectric element 3 are electrically connected.

Figure 6D:
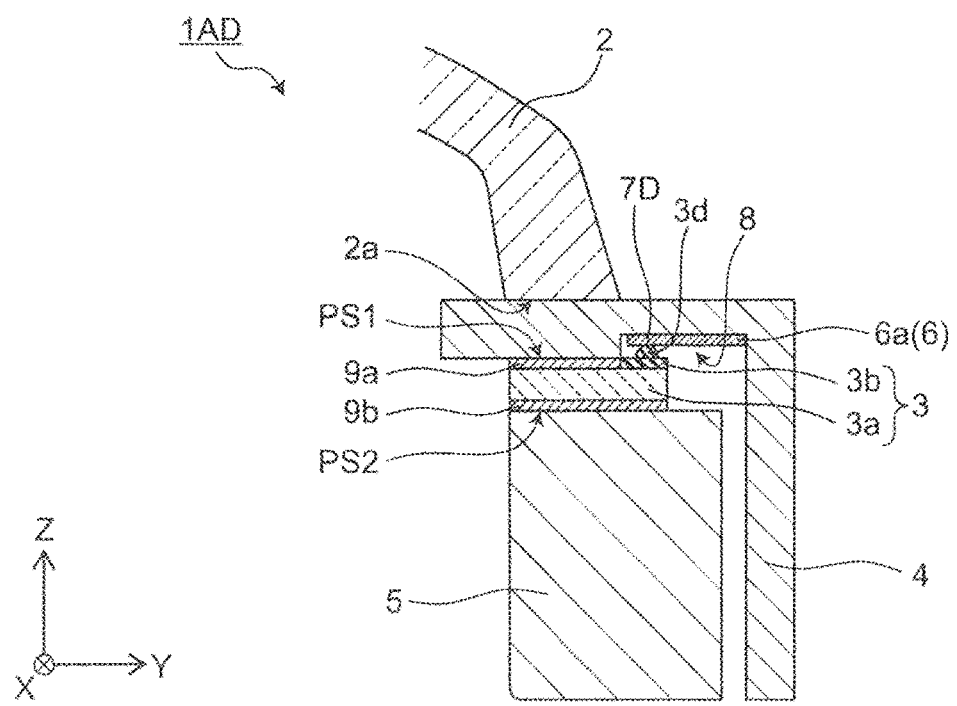
FIG. 6D is a partial enlarged view of a vibration device of a modification of Preferred Embodiment 1 of the present invention.

In a vibration device 1AD illustrated in FIG. 6D, an elastic portion 7D is defined by a portion of the power feed conductor 6, and is a plate-shaped structure extending in the Y direction from the inner periphery of the annular portion 6a. The vibration device 1AD includes a projection 3d provided on the piezoelectric element 3. The projection 3d is provided on the electrode 3b of the piezoelectric element 3. The projection 3d has a hemispherical shape, for example. The projection 4d is disposed between the elastic portion 7D and the piezoelectric element 3. With this, the power feed conductor 6 and the piezoelectric element 3 are electrically connected.

Note that, an example has been described in which the elastic portion 7 is defined by a portion of the power feed conductor 6, but the present invention is not limited thereto.

The elastic portion 7 may be able to press the power feed conductor 6 against the piezoelectric element 3 and to bring the power feed conductor 6 into contact with the piezoelectric element 3. The elastic portion 7 may be a separate body from the power feed conductor 6. For example, the elastic portion 7 may be a conductive elastic member disposed between the power feed conductor 6 and the electrode 3b of the piezoelectric element 3 in the groove 8.

Preferred Embodiment 2

A vibration device according to Preferred Embodiment 2 of the present invention will be described. Note that, in Preferred Embodiment 2, differences from Preferred Embodiment 1 will mainly be described. In Preferred Embodiment 2, components the same as or similar to those in Preferred Embodiment 1 will be described being denoted by the same reference numerals. Further, in Preferred Embodiment 2, description overlapping with that of Preferred Embodiment 1 will be omitted.

Figure 7:
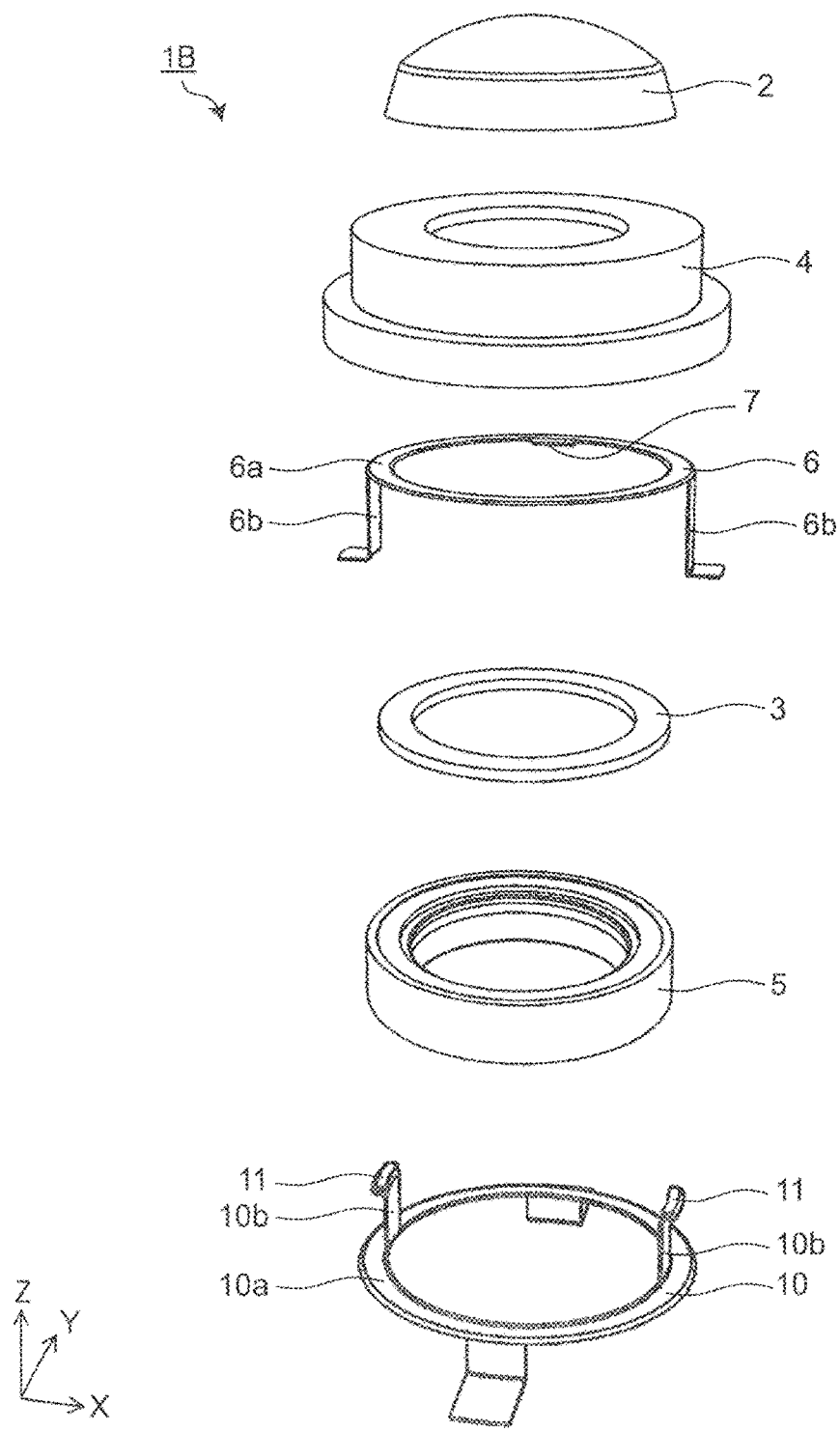
FIG. 7 is an exploded perspective view of a vibration device of Preferred Embodiment 2 of the present invention.
Figure 8A:
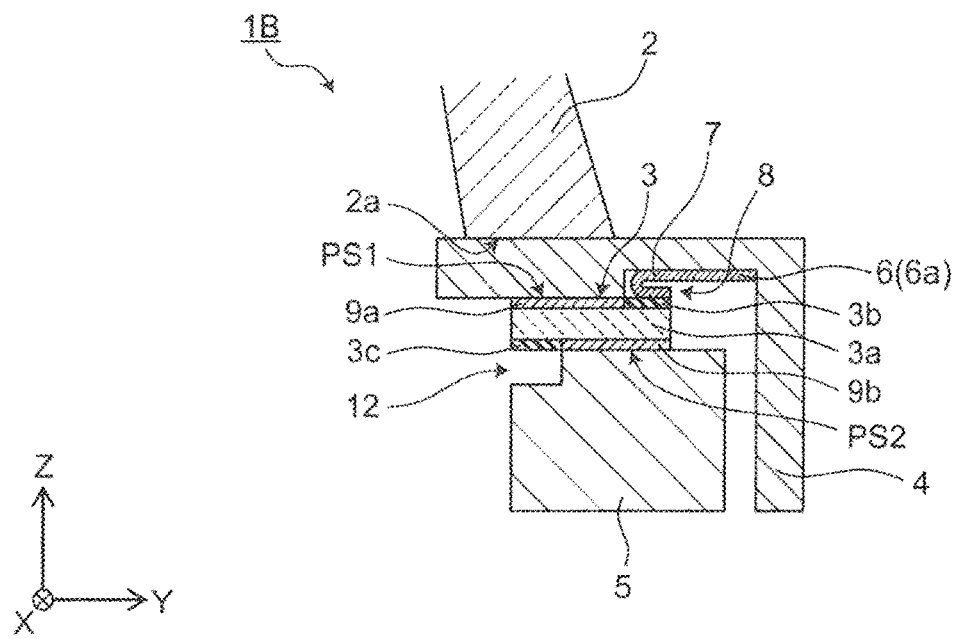
FIG. 8A is a partial enlarged sectional view of a first elastic portion of an example of the vibration device of Preferred Embodiment 2 of the present invention.
Figure 8B:
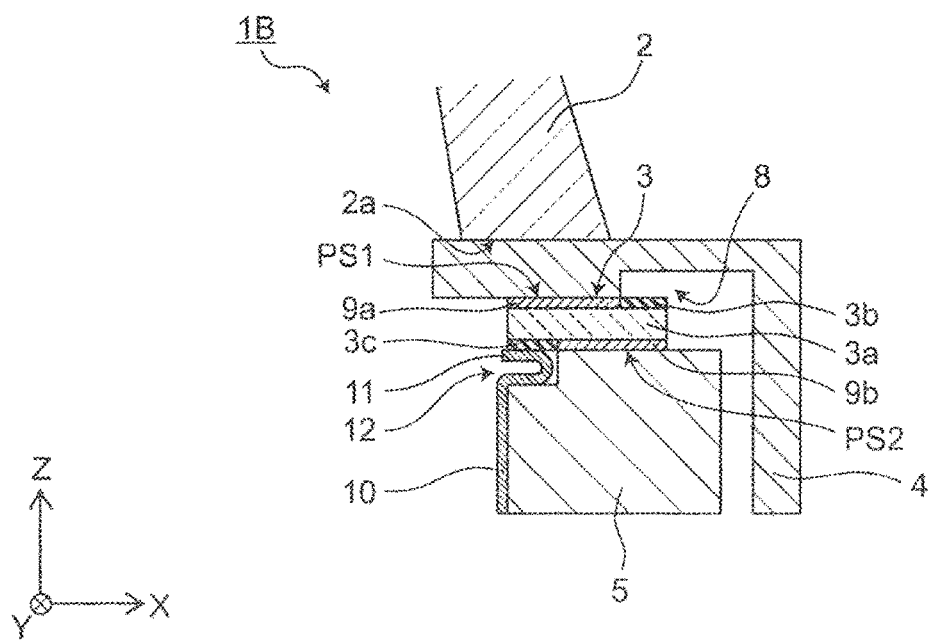
FIG. 8B is a partial enlarged sectional view of a second elastic portion of an example of the vibration device of Preferred Embodiment 2 of the present invention.
Figure 9:
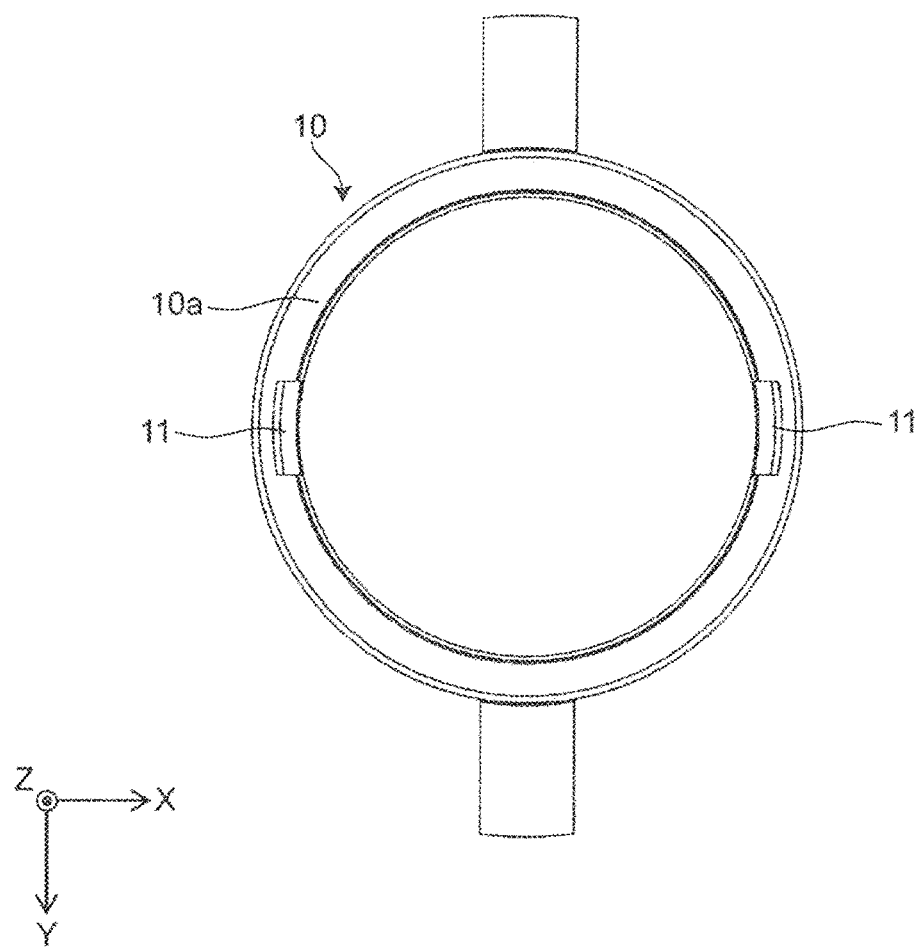
FIG. 9 is a schematic diagram viewed from above of an example of a power feed conductor in Preferred Embodiment 2 of the present invention.

FIG. 7 is an exploded perspective view illustrating an example of a vibration device 1B of Preferred Embodiment 2 of the present invention. FIG. 8A is a partially enlarged sectional view of a first elastic portion 7 as an example of the vibration device 1B of Preferred Embodiment 2 of the present invention. FIG. 8B is a partially enlarged sectional view of a second elastic portion 11 as an example of the vibration device 1B of Preferred Embodiment 2 of the present invention. FIG. 9 is a schematic diagram viewed from above of an example of a second power feed conductor 10 in Preferred Embodiment 2 of the present invention.

In Preferred Embodiment 2, the electrode 3b of the piezoelectric element 3, the power feed conductor 6, the elastic portion 7, and the groove 8 of Preferred Embodiment 1 are referred to as a first electrode 3b, a first power feed conductor 6, the first elastic portion 7, and a first groove 8, respectively.

Preferred Embodiment 2 is different from Preferred Embodiment 1 in that the second power feed conductor 10 and the plurality of second elastic portions 11 are provided, a second electrode 3c is provided on the piezoelectric element 3 on the side of the second surface PS2, and a second groove 12 is provided on the second vibration body 5.

As illustrated in FIG. 7 to FIG. 9, the vibration device 1B includes the second power feed conductor 10 and the plurality of second elastic portions 11 in addition to the configuration of the vibration device 1A of Preferred Embodiment 1. In Preferred Embodiment 2, two second elastic portions 11 are provided on the second power feed conductor 10. The two first elastic portions 7 are opposed to each other in the Y direction, whereas the two second elastic portions 11 are opposed to each other in the X direction.

The configuration of the vibration device 1B illustrated in FIG. 8A and the configuration of the vibration device 1A of Preferred Embodiment 1 illustrated in FIG. 3 are the same or substantially the same except the following points. In the vibration device 1B, the second electrode 3c is provided on the piezoelectric element 3 on the side of the second surface PS2, and the second groove 12 for exposing the second electrode 3c is provided on the second vibration body 5.

The second electrode 3c is in contact with the second power feed conductor 10. The second electrode 3c is provided on the inner peripheral side of the piezoelectric element 3 on the second surface PS2 of the piezoelectric element 3. The second electrode 3c has an annular shape on the second surface PS2 of the piezoelectric element 3. On the second surface PS2 of the piezoelectric element 3, the region in which the second electrode 3c is provided is smaller than the connection region 9b of the second vibration body 5. In other words, on the second surface PS2 of the piezoelectric element 3, the contact region of the second power feed conductor 10 and the piezoelectric element 3 is smaller than the connection region 9b of the second vibration body 5 and the piezoelectric element 3.

The second groove 12 exposes the second electrode 3c of the piezoelectric element 3 from the second vibration body 5. The second groove 12 is recessed from the inner peripheral side toward the outer peripheral side of the second vibration body 5. The second groove 12 is recessed in an annular shape, for example.

The second power feed conductor 10 and the plurality of second elastic portions 11 will be described in detail.
Second Power Feed Conductor The second power feed conductor 10 is in contact with the piezoelectric element 3, and feeds power to the piezoelectric element 3. The second power feed conductor 10 is in contact with the piezoelectric element 3 on the inner peripheral side of the piezoelectric element 3 relative to the first power feed conductor 6. Further, the second power feed conductor 10 is in contact with the piezoelectric element 3 on the side of the second surface PS2.

The second power feed conductor 10 includes an annular portion 10a and a plurality of protruding portions 10b.

The annular portion 10a has an annular shape. Further, the annular portion 10a is a plate-shaped structure. The annular portion 10a is attached to the second vibration body 5.

The plurality of protruding portions 10b are plate-shaped structures extending from the annular portion 10a. The plurality of protruding portions 10b extend along the inner periphery of the second vibration body 5 in the Z direction. Further, the second elastic portion 11 is provided on each of the end portions of the plurality of protruding portions 10b.

In Preferred Embodiment 2, two protruding portions 10b are provided on the annular portion 10a. The two protruding portions 10b are opposed to each other in the X direction in the annular portion 10a.

The second power feed conductor 10 is made of a material having conductivity. The material of the second power feed conductor 10 is metal such as stainless steel, beryllium copper, nickel silver, or copper, for example.

The second power feed conductor 10 is connected to a power supply circuit, for example.
Second Elastic Portions Referring back to FIG. 8B, the plurality of second elastic portions 11 press the second power feed conductor 10 against the piezoelectric element 3. The plurality of second elastic portions 11 press the second power feed conductor 10 against the second electrode 3c provided on the second surface PS2 of the piezoelectric element 3. Specifically, the plurality of second elastic portions 11 are disposed in the second groove 12 provided on the second vibration body 5. The plurality of second elastic portions 11 press the second power feed conductor 10 toward the second electrode 3c of the piezoelectric element 3 in the second groove 12.

The second elastic portion 11 has a configuration similar to that of the first elastic portion 7. Specifically, the second elastic portion 11 is provided by bending the second power feed conductor 10, and has a plate spring shape provided by curving the second power feed conductor 10. Specifically, a plate-shaped structure protrudes from an end portion of the protruding portion 10b of the second power feed conductor 10 toward the outer peripheral side of the annular portion 10a. The second elastic portion 11 is provided by curving the plate-shaped structure in a U-shape.

The second elastic portion 11 is a plate-shaped structure having a thickness of about 0.2 mm, for example. The second elastic portion 11 is made of the same material as that of the second power feed conductor 10. The material of the second elastic portion 11 is metal such as stainless steel, beryllium copper, nickel silver, or copper, for example.

As described above, the second elastic portion 11 is defined by a portion of the second power feed conductor 10, and presses the second power feed conductor 10 against the second electrode 3c of the piezoelectric element 3. With this, even when the piezoelectric element 3 vibrates, the breakage of the electrical connection between the second power feed conductor 10 and the second electrode 3c of the piezoelectric element 3 may be reduced or prevented.

Referring back to FIG. 9, in Preferred Embodiment 2, two second elastic portions 11 are opposed to each other in the X direction in the annular portion 10a.

In plan view of the vibration device 1B, the plurality of second elastic portions 11 are disposed between the plurality of first elastic portions 7. In other words, in plan view of the vibration device 1B, the plurality of second elastic portions 11 do not overlap with the plurality of first elastic portions 7. The plurality of second elastic portions 11 and the plurality of first elastic portions 7 are alternately disposed.

Advantageous Effects

With the use of the vibration device 1B according to Preferred Embodiment 2, the following advantageous effects may be obtained.

The vibration device 1B includes the light-transmissive cover 2, the piezoelectric element 3, the plurality of vibration bodies 4 and 5, the plurality of power feed conductors 6 and 10, and the plurality of elastic portions 7 and 11. The piezoelectric element 3 includes the first surface PS1 and the second surface PS2 on the side opposite to the first surface PS1. The plurality of power feed conductors 6 and 10 include the first power feed conductor 6 in contact with the first surface PS1 and the second power feed conductor 10 in contact with the second surface PS2. The plurality of elastic portions 7 and 11 include the plurality of first elastic portions 7 to press the first power feed conductor 6 to the first surface PS1, and the plurality of second elastic portions 11 to press the second power feed conductor 10 to the second surface PS2. With this configuration, the reliability of the connection between the piezoelectric element 3 and the plurality of power feed conductors 6 and 10 is increased.

The piezoelectric element 3 has an annular shape. The plurality of vibration bodies 4 and 5 include the first vibration body 4 connected to the bottom surface 2a of the light-transmissive cover 2 and the first surface PS1 of the piezoelectric element 3, and the second vibration body 5 connected to the second surface PS2 of the piezoelectric element 3. The second power feed conductor 10 is in contact with the piezoelectric element 3 on the inner peripheral side of the piezoelectric element 3 relative to the first power feed conductor 6. With this configuration, the first power feed conductor 6 may be pressed against the first surface PS1 of the piezoelectric element 3 on the outer peripheral side of the piezoelectric element 3 by the plurality of first elastic portions 7. Further, the second power feed conductor 10 may be pressed to the second surface PS2 of the piezoelectric element 3 on the inner peripheral side of the piezoelectric element 3 by the plurality of second elastic portions 11. With this, the reliability of the connection between the piezoelectric element 3 and the plurality of power feed conductors 6 and 10 may further be increased.

In the first surface PS1 of the piezoelectric element 3, the contact region of the first power feed conductor 6 and the piezoelectric element 3 is smaller than the connection region 9a of the first vibration body 4 and the piezoelectric element 3. In the second surface PS2 of the piezoelectric element 3, the contact region of the second power feed conductor 10 and the piezoelectric element 3 is smaller than the connection region 9b of the second vibration body 5 and the piezoelectric element 3. With this configuration, the reliability of the connection between the piezoelectric element 3 and the plurality of power feed conductors 6 and 10 is increased while reducing or preventing the attenuation of the vibration due to the plurality of elastic portions 7 and 11.

The piezoelectric element 3 includes the first electrode 3b provided on the first surface PS1 and the second electrode 3c provided on the second surface PS2. The first vibration body 4 includes the first groove 8 exposing the first electrode 3b. The second vibration body 5 includes the second groove 12 exposing the second electrode 3c. The plurality of first elastic portions 7 are disposed in the first groove 8. The plurality of second elastic portions 11 are disposed in the second groove 12. With this configuration, the reliability of the connection between the piezoelectric element 3 and the plurality of power feed conductors 6 and 10 may be further increased.

Note that an example has been described in which the vibration device 1B includes the plurality of second elastic portions 11 in Preferred Embodiment 2, but the present invention is not limited thereto. The vibration device 1B may include one or a plurality of second elastic portions 11.

An example has been described in which the second electrode 3c is provided on the inner peripheral side on the second surface PS2 of the piezoelectric element 3 in Preferred Embodiment 2, but the present invention is not limited thereto. The second electrode 3c may be provided at a position where the piezoelectric element 3 and the power feed conductor 6 are in contact with each other. For example, the second electrode 3c may be provided on the outer peripheral side on the first surface PS1 of the piezoelectric element 3. Alternatively, the second electrode 3c may be provided on the first surface PS1 of the piezoelectric element 3.

An example has been described in which the second electrode 3c has an annular shape in Preferred Embodiment 2, but the present invention is not limited thereto. The second electrode 3c may be provided on a portion which is in contact with the second power feed conductor 10. For example, the plurality of second electrodes 3c having a rectangular shape may be provided on the second surface PS2 of the piezoelectric element 3.

An example has been described in which the second power feed conductor 10 is in contact with the piezoelectric element 3 on the side of the second surface PS2 in Preferred Embodiment 2, but the present invention is not limited thereto. For example, the second power feed conductor 10 may be in contact with the piezoelectric element 3 on the side of the first surface PS1. In this case, the first power feed conductor 6 may be in contact with the piezoelectric element 3 on the side of the second surface PS2.

An example has been described in which the second groove 12 provided on the second vibration body 5 has an annular shape in Preferred Embodiment 2, but the present invention is not limited thereto. In the second vibration body 5, one or a plurality of second grooves 12 with a space, in which the second power feed conductor 10 and the plurality of second elastic portions 11 are disposed, may be provided.

Further, one or a plurality of second grooves 12 may expose the second electrode 3c from the second vibration body 5.

An example has been described in which the plurality of second elastic portions 11 are opposed to each other in the X direction on the annular portion 10a of the second power feed conductor 10 in Preferred Embodiment 2, but the present invention is not limited thereto. The plurality of second elastic portions 11 may be randomly disposed on the annular portion 10a of the second power feed conductor 10.

An example has been described in which the plurality of second elastic portions 11 are alternately disposed between the plurality of first elastic portions 7 in Preferred Embodiment 2, but the present invention is not limited thereto. The plurality of second elastic portions 11 may be opposed to the plurality of first elastic portions 7.

An example has been described in which the second elastic portion 11 is provided by bending a portion of the second power feed conductor 10 and has a plate spring shape provided by curving a portion of the second power feed conductor 10 in a U-shape in Preferred Embodiment 2, but the present invention is not limited thereto. The second elastic portion 11 may have a shape to press the second power feed conductor 10 against the piezoelectric element 3 and to bring the second power feed conductor 10 into contact with the piezoelectric element 3. The second elastic portion 11 may have various shapes similarly to the first elastic portion 7. For example, the second elastic portion 11 may be provided by bending the second power feed conductor 10 in a coil shape. The second elastic portion 11 may have a V-shape, a W-shape, or the like, for example. Alternatively, the second elastic portion 11 may be a separate body from the second power feed conductor 10.

Figure 10A:
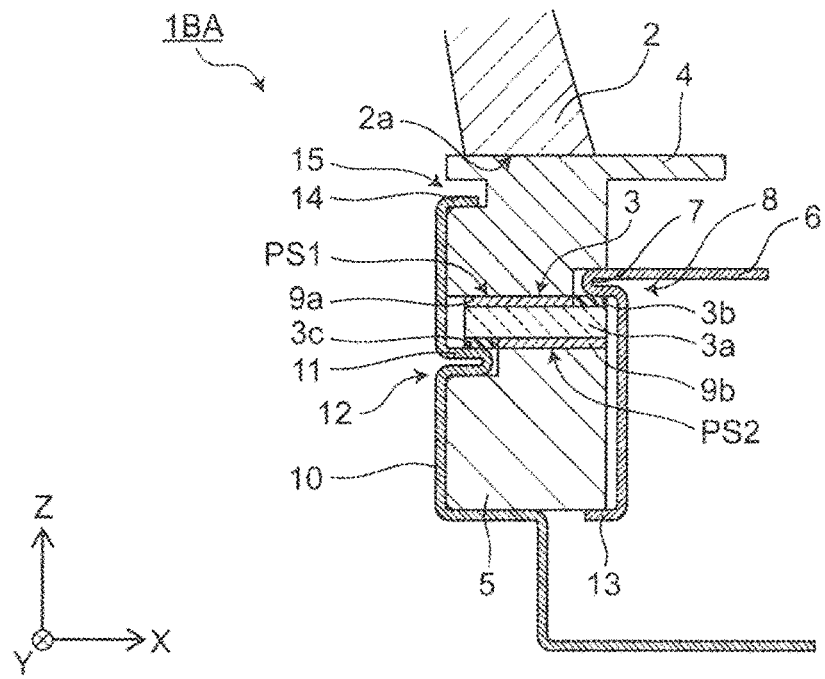
FIG. 10A is a partial enlarged view of a vibration device of a modification of Preferred Embodiment 2 of the present invention.
Figure 10B:
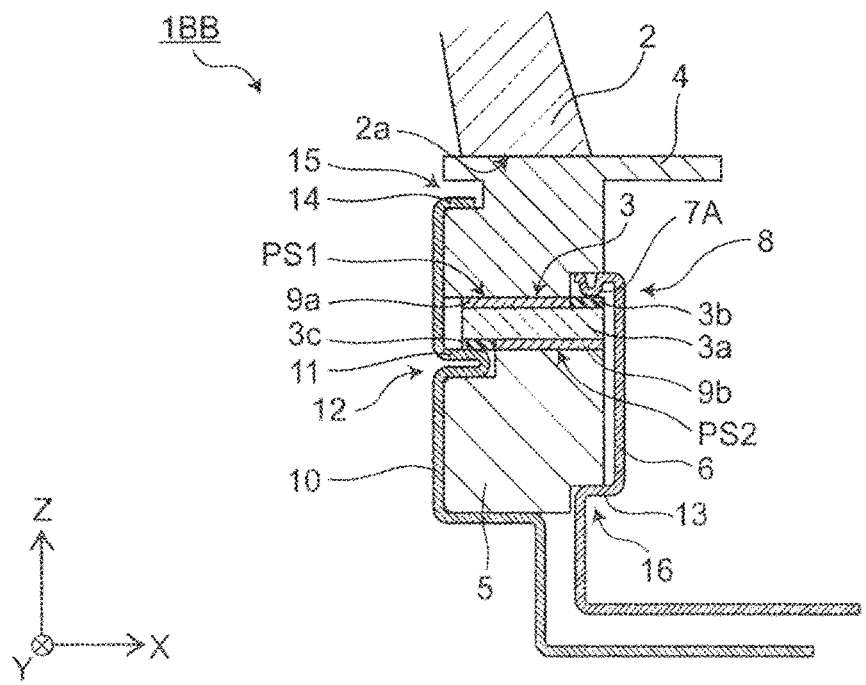
FIG. 10B is a partial enlarged view of a vibration device of a modification of Preferred Embodiment 2 of the present invention.
Figure 10C:
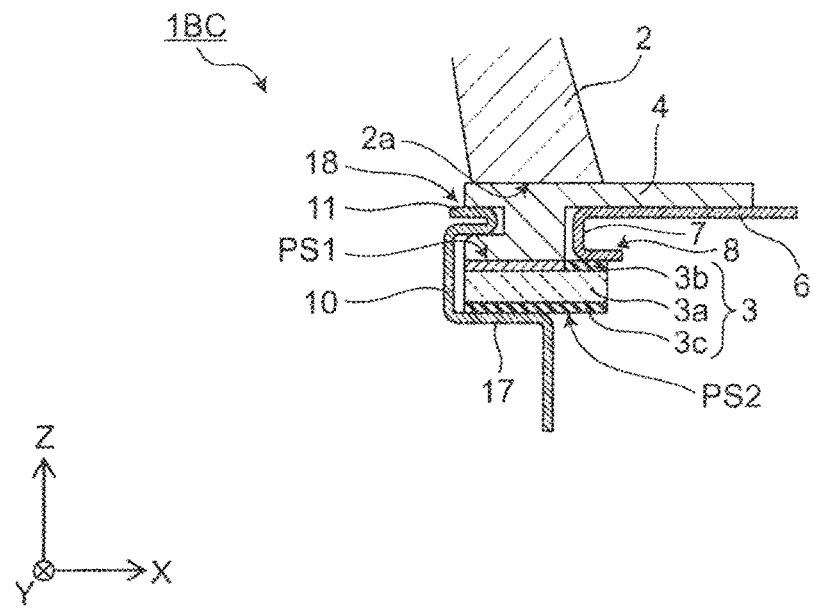
FIG. 10C is a partial enlarged view of a vibration device of a modification of Preferred Embodiment 2 of the present invention.

FIGS. 10A to 10C are partial enlarged views illustrating a configuration of a vibration device of a modification of Preferred Embodiment 2 of the present invention. In FIGS. 10A to 10C, the first elastic portions 7 and 7A, and the second elastic portion 11 are illustrated in the same section for ease of description. However, the positions of the first elastic portions 7 and 7A, and the second elastic portion 11 are not limited thereto. The first elastic portions 7 and 7A, and the second elastic portion 11 may not be in the same section.

In a vibration device 1BA illustrated in FIG. 10A, the first power feed conductor 6 includes a first support portion 13 extending in the direction (X and Y direction) intersecting the thickness direction (Z direction) of the piezoelectric element 3, and holds the piezoelectric element 3 between the first elastic portion 7 and the first support portion 13. In the vibration device 1BA, the first elastic portion 7 is provided in the middle of the first power feed conductor 6. The first support portion 13 is provided by bending the first power feed conductor 6, and is provided on an end portion of the first power feed conductor 6.

The first support portion 13 extends from the first elastic portion 7 disposed in the first groove 8 along the outer peripheral portion of the second vibration body 5 in the Z direction, and bends in the direction (X and Y direction) intersecting the thickness direction (Z direction) of the piezoelectric element 3. With this, the first support portion 13 engages with the second vibration body 5, and the piezoelectric element 3 and the second vibration body 5 are held between the first elastic portion 7 and the first support portion 13. The first support portion 13 is a plate-shaped structure, for example.

The second power feed conductor 10 includes a second support portion 14 extending in a direction (X and Y direction) intersecting the thickness direction (Z direction) of the piezoelectric element 3, and holds the piezoelectric element 3 between the second elastic portion 11 and the second support portion 14. In the vibration device 1BA, the second elastic portion 11 is provided in the middle of the second power feed conductor 10. The second support portion 14 is provided by bending the second power feed conductor 10, and is provided on an end portion of the second power feed conductor 10.

The second support portion 14 extends from the second elastic portion 11 disposed in the second groove 12 along the outer peripheral portion of the first vibration body 4 in the Z direction, and bends in the direction (X and Y direction) intersecting with the thickness direction (Z direction) of the piezoelectric element 3. With this, the first support portion 13 engages with a third groove 15 provided on the first vibration body 4, and the piezoelectric element 3 and the first vibration body 4 are held between the second elastic portion 11 and the second support portion 14. The third groove 15 is positioned above the surface at which the first vibration body 4 is in contact with the piezoelectric element 3, and is recessed from the inner peripheral side toward the outer peripheral side of the first vibration body 4. The second support portion 14 is a plate-shaped structure, for example.

In a vibration device 1BB illustrated in FIG. 10B, a first elastic portion 7A is provided on an end portion of the first power feed conductor 6. The first support portion 13 is provided in the middle of the first power feed conductor 6. Further, in the vibration device 1BB, a step 16 is provided at a corner on the outer peripheral side of the second vibration body 5. The first support portion 13 is disposed to the step 16. With this, the first support portion 13 engages with the step 16 of the second vibration body 5, and the piezoelectric element 3 and the second vibration body 5 are held between the first elastic portion 7A and the first support portion 13.

In a vibration device 1BC illustrated in FIG. 10C, the second power feed conductor 10 includes a third support portion 17 extending in the direction (X and Y direction) intersecting with the thickness direction (Z direction) of the piezoelectric element 3, and holds the piezoelectric element 3 between the second elastic portion 11 and the third support portion 17. In the vibration device 1BC, the second elastic portion 11 is provided on an end portion of the second power feed conductor 10. The third support portion 17 is provided by bending the second power feed conductor 10, and is provided in the middle of the second power feed conductor 10. Further, the vibration device 1BC does not include the second vibration body 5, and the second electrode 3c is provided on the entire or substantially the entire surface of the second surface PS2 of the piezoelectric element 3.

The second elastic portion 11 is disposed in a fourth groove 18 provided on the first vibration body 4. The fourth groove 18 is above the first surface PS1 of the piezoelectric element 3, and is recessed from the inner peripheral side toward the outer peripheral side of the first vibration body 4. The second elastic portion 11 is not in contact with the piezoelectric element 3.

The third support portion 17 extends from the second elastic portion 11 disposed in the fourth groove 18 along the outer peripheral portion of the first vibration body 4 and the side of the piezoelectric element 3 in the Z direction, and bends in the direction (X and Y direction) intersecting with the thickness direction (Z direction) of the piezoelectric element 3. With this, the third support portion 17 engages with the second surface PS2 of the piezoelectric element 3, and the piezoelectric element 3 and the first vibration body 4 are held between the second elastic portion 11 and the third support portion 17. The third support portion 17 is a plate-shaped structure, for example.

In the vibration device 1BC, the third support portion 17 is pressed to the second surface PS2 of the piezoelectric element 3 by the second elastic portion 11. With this, the piezoelectric element 3 is held between the second elastic portion 11 and the third support portion 17.

Further, the second power feed conductor 10 feeds power to the piezoelectric element 3 by bringing the third support portion 17 and the second electrode 3c of the piezoelectric element 3 into electrical contact with each other.

With the configuration of the modification described above, the reliability of the connection between the plurality of power feed conductors 6 and 10 and the piezoelectric element 3 may be further increased.

Note that the modifications illustrated in FIGS. 10A to 10C are merely examples, and the vibration devices 1BA to 1BC are not limited to these examples. For example, the vibration devices 1BA to 1BC may include one or a plurality of first support portions 13, one or a plurality of second support portions 14, one or a plurality of third grooves 15, one or a plurality of third support portions 17, and/or one or a plurality of fourth grooves 18. Alternatively, the vibration devices 1BA to 1BC may include at least any one of the first support portion 13, the second support portion 14, and the third support portion 17.

In the modifications illustrated in FIGS. 10A to 10C, the names of the first support portion 13, the second support portion 14, and the third support portion 17 are used for ease of description, but the names are not limited thereto. The names may be changed depending on the number of support portions. For example, the third support portion 17 may be referred to as a second support portion, and the second support portion 14 may be referred to as a third support portion.

Preferred Embodiment 3

A vibration device according to Preferred Embodiment 3 of the present invention will be described. Note that, in Preferred Embodiment 3, differences from Preferred Embodiment 2 will mainly be described. In Preferred Embodiment 3, components the same as or similar to those in Preferred Embodiment 2 will be described being denoted by the same reference numerals. Further, in Preferred Embodiment 3, description overlapping with that of Preferred Embodiment 2 will be omitted.

Figure 11:
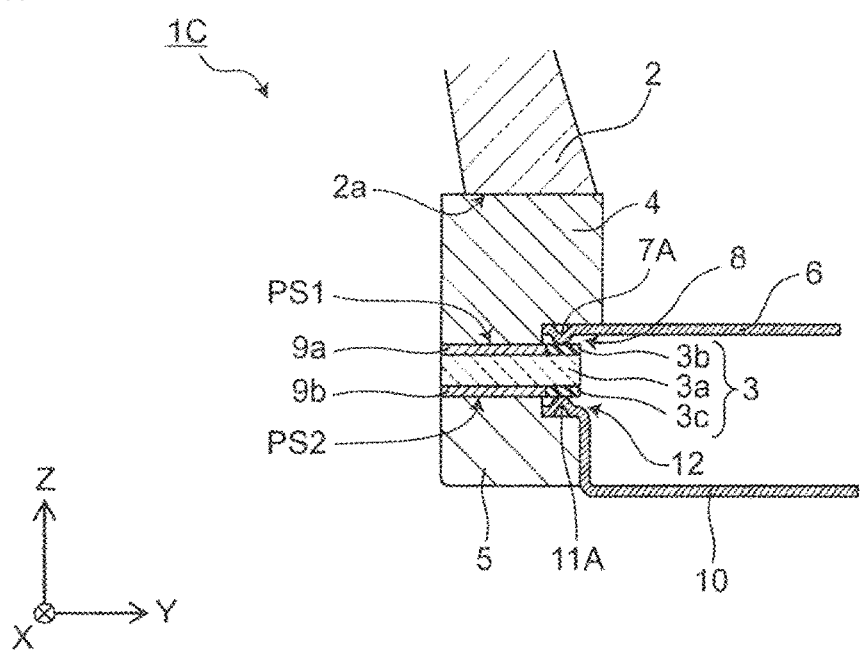
FIG. 11 is a partial enlarged sectional view of an example of a vibration device of Preferred Embodiment 3 of the present invention.

FIG. 11 is a partially enlarged sectional view of an example of a vibration device 1C of Preferred Embodiment 3 of the present invention.

The Preferred Embodiment 3 is different from Preferred Embodiment 2 in that the first elastic portion 7A and a second elastic portion 11A are disposed on the outer peripheral side of the piezoelectric element 3, and sandwich and support the piezoelectric element 3.

As illustrated in FIG. 11, the second electrode 3c is provided on the outer peripheral side of the piezoelectric element on the second surface PS2 of the piezoelectric element 3. Specifically, the second electrode 3c is opposed to the first electrode 3b.

Further, the second groove 12 is provided on the outer periphery of the second vibration body 5. Specifically, the second groove 12 is recessed from the outer peripheral side toward the inner peripheral side of the second vibration body 5. With this, the second groove 12 exposes the second electrode 3c from the second vibration body 5.

The second elastic portion 11A is disposed in the second groove 12. In the second groove 12, the second elastic portion 11A presses the second power feed conductor 10 against the second electrode 3c of the piezoelectric element 3. Specifically, the second elastic portion 11A is defined by a portion of the second power feed conductor 10, and is in contact with the second electrode 3c of the piezoelectric element 3. With this, the second power feed conductor 10 is electrically connected to the second electrode 3c of the piezoelectric element 3 via the second elastic portion 11A.

Whereas, the first elastic portion 7A is disposed in the first groove 8 provided on the first vibration body 4. In the first groove 8, the first elastic portion 7A presses the first power feed conductor 6 against the first electrode 3b of the piezoelectric element 3. Specifically, the first elastic portion 7A is defined by a portion of the first power feed conductor 6, and is in contact with the first electrode 3b of the piezoelectric element 3. With this, the first power feed conductor 6 is electrically connected to the first electrode 3b of the piezoelectric element 3 via the first elastic portion 7A.

The first elastic portion 7A and the second elastic portion 11A overlap with each other in the height direction (Z direction) of the vibration device 1C. That is, the first elastic portion 7A and the second elastic portion 11A are opposed to each other in the thickness direction (Z direction) of the piezoelectric element 3. With this, the piezoelectric element 3 is sandwiched and supported by the first elastic portion 7A and the second elastic portion 11A.

Advantageous Effects

With the use of the vibration device 1C according to Preferred Embodiment 3, the following advantageous effects are obtained.

In the vibration device 1C, the plurality of power feed conductors 6 and 10 include the first power feed conductor 6 in contact with the first surface PS1 and the second power feed conductor 10 in contact with the second surface PS2. The plurality of elastic portions 7A and 11A include the plurality of first elastic portions 7A to press the first power feed conductor 6 to the first surface PS1 and the plurality of second elastic portions 11A to press the second power feed conductor 10 to the second surface PS2. The plurality of first elastic portions 7A and the plurality of second elastic portions 11A are opposed to each other in the thickness direction (Z direction) of the piezoelectric element 3. With this, the piezoelectric element 3 may be sandwiched and supported by the plurality of first elastic portions 7A and the plurality of second elastic portions 11A. As a result, the reliability of the connection between the piezoelectric element 3 and the plurality of power feed conductors 6 and 10 is further increased.

Note that, an example has been described in which the first electrode 3b and the second electrode 3c are provided on the outer peripheral side of the piezoelectric element 3 in Preferred Embodiment 3, but the present invention is not limited thereto. The first electrode 3b and the second electrode 3c may be provided at positions opposed to each other across the piezoelectric element 3. For example, the first electrode 3b and the second electrode 3c may be provided on the inner peripheral side of the piezoelectric element 3.

An example has been described in which the first elastic portion 7A and the second elastic portion 11A sandwich and support the piezoelectric element 3 on the outer peripheral side of the piezoelectric element 3 in Preferred Embodiment 3, but the present invention is not limited thereto. The first elastic portion 7A and the second elastic portion 11A may be opposed to each other in the thickness direction (Z direction) of the piezoelectric element 3.

Figure 12A:
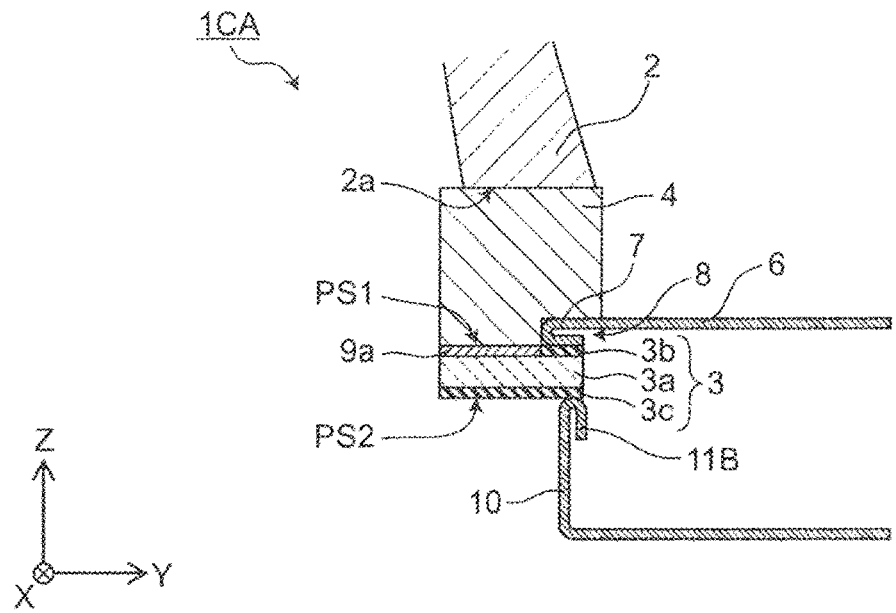
FIG. 12A is a partial enlarged view of a vibration device of a modification of Preferred Embodiment 3 of the present invention.
Figure 12B:
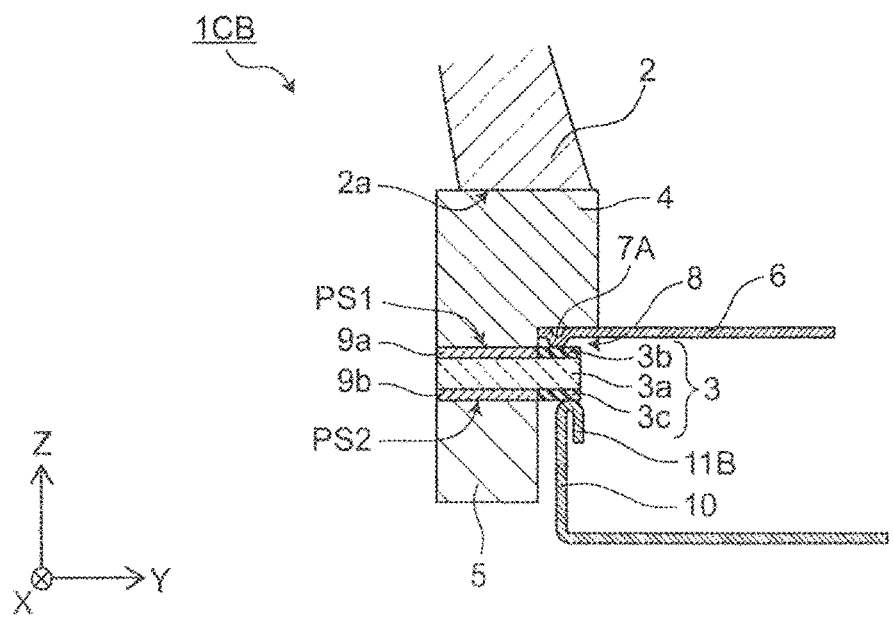
FIG. 12B is a partial enlarged view of a vibration device of a modification of Preferred Embodiment 3 of the present invention.

FIGS. 12A and 12B are partial enlarged views of a vibration device of a modification of Preferred Embodiment 3 according to the present invention. Note that in a vibration device 1CA illustrated in FIG. 12A, the second vibration body 5 is provided on the piezoelectric element 3 on the side of the second surface PS2. Whereas, in a vibration device 1CB illustrated in FIG. 12B, the second vibration body 5 is not provided on the piezoelectric element 3 on the side of the second surface PS2.

As illustrated in FIGS. 12A and 12B, a second elastic portion 11B is disposed to the piezoelectric element 3 on the side of the second surface PS2. The second elastic portion 11B includes two plate-shaped structures facing each other with a space therebetween and a curved portion connecting the two plate-shaped structures. In the second elastic portion 11B, the two plate-shaped structures face each other with a space therebetween in the Y direction. The curved portion is curved in a U-shape in the Z direction, and is in contact with the second electrode 3c of the piezoelectric element 3.

With this configuration, the piezoelectric element 3 may be sandwiched and supported by the first elastic portion 7 and the second elastic portion 11B or by the first elastic portion 7A and the second elastic portion 11B. With this, the reliability of the connection between the piezoelectric element 3 and the plurality of power feed conductors 6 and 10 is further increased.

Preferred Embodiment 4

A vibration device according to Preferred Embodiment 4 of the present invention will be described. Note that, in Preferred Embodiment 4, differences from Preferred Embodiment 1 will mainly be described. In Preferred Embodiment 4, components the same as or similar to those in Preferred Embodiment 1 will be described being denoted by the same reference numerals. Further, in Preferred Embodiment 4, description overlapping with that of Preferred Embodiment 1 will be omitted.

Figure 13:
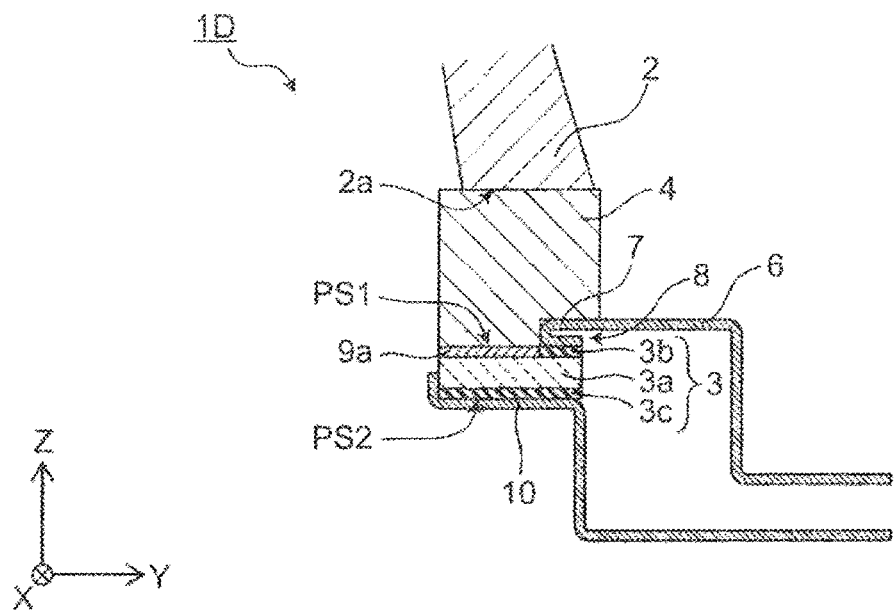
FIG. 13 is a partial enlarged sectional view of an example of a vibration device of Preferred Embodiment 4 of the present invention.

FIG. 13 is a partially enlarged sectional view of an example of a vibration device 1D of Preferred Embodiment 4 of the present invention.

Preferred Embodiment 4 is different from Preferred Embodiment 1 in that the second vibration body 5 is not provided and that the second power feed conductor 10 is provided.

As illustrated in FIG. 13, on the side of the first surface PS1 of the piezoelectric element 3, the elastic portion 7 presses the first power feed conductor 6 against the first electrode 3b of the piezoelectric element 3 in the groove 8. Whereas, the second power feed conductor 10 is disposed in contact with the piezoelectric element on the side of the second surface PS2.

Specifically, the second electrode 3c is provided on the entire or substantially the entire surface of the second surface PS2 of the piezoelectric element 3. The second power feed conductor 10 is disposed in contact with the second electrode 3c.

Advantageous Effects

With the use of the vibration device 1D according to Preferred Embodiment 4, the following advantageous effects may be obtained.

In the vibration device 1D, the first power feed conductor 6 is pressed against the piezoelectric element 3 by the elastic portion 7 provided on the first power feed conductor 6. Whereas, the second power feed conductor 10 is not provided with an elastic portion. Further, the second vibration body 5 is provided on the piezoelectric element 3 on the side of the second surface PS2. Even in this configuration, the reliability of the connection between the piezoelectric element 3 and the plurality of power feed conductors 6 and 10 is increased.

Note that, an example has been described in which the vibration device 1D includes the elastic portion 7 to press the first power feed conductor 6 to the piezoelectric element 3 in Preferred Embodiment 4, but the present invention is not limited thereto. The vibration device 1D may include an elastic portion to press at least one of the first power feed conductor 6 and the second power feed conductor 10 to the piezoelectric element 3. For example, the vibration device 1D may include an elastic portion to press the second power feed conductor 10 to the piezoelectric element 3. In this case, the vibration device 1D may not include the elastic portion 7 to press the first power feed conductor 6 to the piezoelectric element 3.

Preferred Embodiment 5

An imaging device according to Preferred Embodiment 5 of the present invention will be described. Note that, in Preferred Embodiment 5, differences from Preferred Embodiment 1 will mainly be described. In Preferred Embodiment 5, components the same as or similar to those in Preferred Embodiment 1 will be described being denoted by the same reference numerals. Further, in Preferred Embodiment 5, description overlapping with that of Preferred Embodiment 1 will be omitted.

Figure 14:
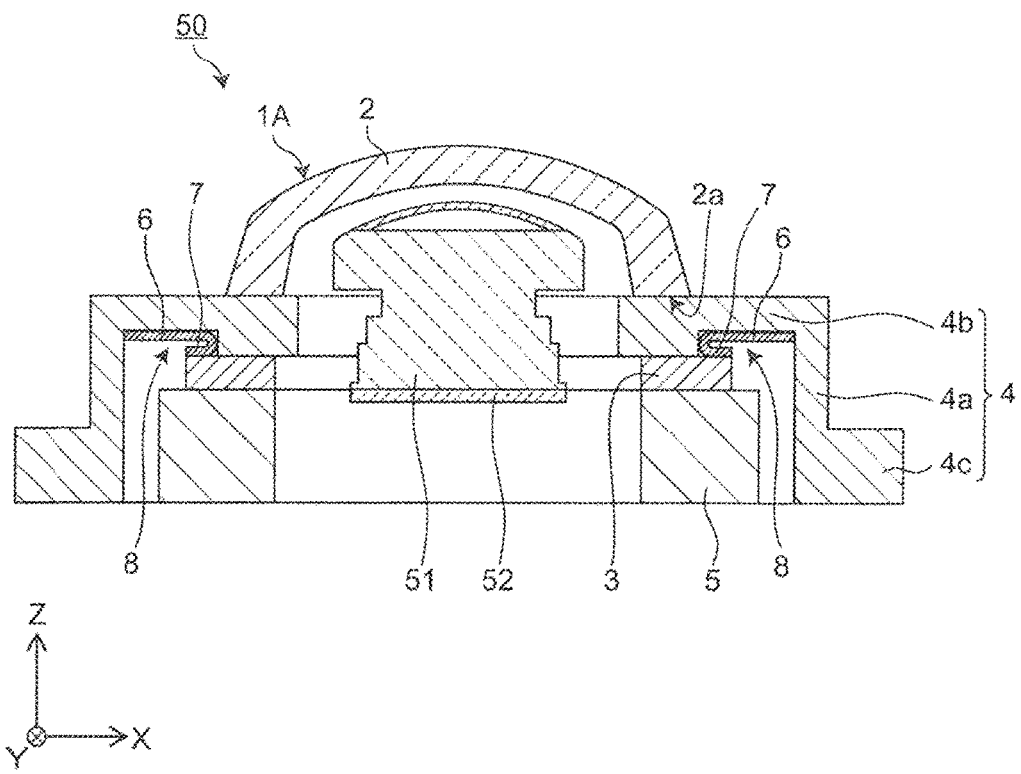
FIG. 14 is a schematic diagram illustrating an example of a configuration of an imaging device of Preferred Embodiment 5 of the present invention.

FIG. 14 is a schematic diagram of an imaging device 50 of Preferred Embodiment 5 of the present invention.

In Preferred Embodiment 5, the imaging device 50 including the vibration device 1A of Preferred Embodiment 1 and an imaging element 51 will be described.

As illustrated in FIG. 14, the imaging device 50 includes the vibration device 1A of Preferred Embodiment 1 and the imaging element 51 disposed in the vibration device 1A. Note that the vibration device 1A is the same or substantially the same as that in Preferred Embodiment 1, and the description thereof will be omitted.

Imaging Element>

The imaging element 51 is disposed in an internal space of the vibration device 1A. The imaging element 51 is mounted on a circuit board 52. The circuit board 52 includes a control circuit for the imaging element to drive the imaging element.

Examples of the imaging element 51 include, for example, CMOS, CCD, a bolometer, a thermopile which receive light having any wavelength in a visible region to a far-infrared region.

Advantageous Effects

With the use of the imaging device 50 according to Preferred Embodiment 5, the following advantageous effects may be obtained.

The imaging device 50 includes the vibration device 1A of Preferred Embodiment 1 and the imaging element 51 disposed in the vibration device 1A. With this configuration, the reliability of the connection between the piezoelectric element 3 and the power feed conductor 6 is increased.

Note that, an example has been described in which the imaging device 50 includes the vibration device 1A of Preferred Embodiment 1 in Preferred Embodiment 5, but the present invention is not limited thereto. The imaging device 50 may include any one of the vibration devices 1A to 1D of Preferred Embodiment 1 to Preferred Embodiment 4.

An example has been described in which the imaging device 50 includes the circuit board 52 in Preferred Embodiment 5, but the present invention is not limited thereto. The circuit board 52 is not a necessary component.

Other Preferred Embodiments

Other preferred embodiments will be described below.

Figure 15:
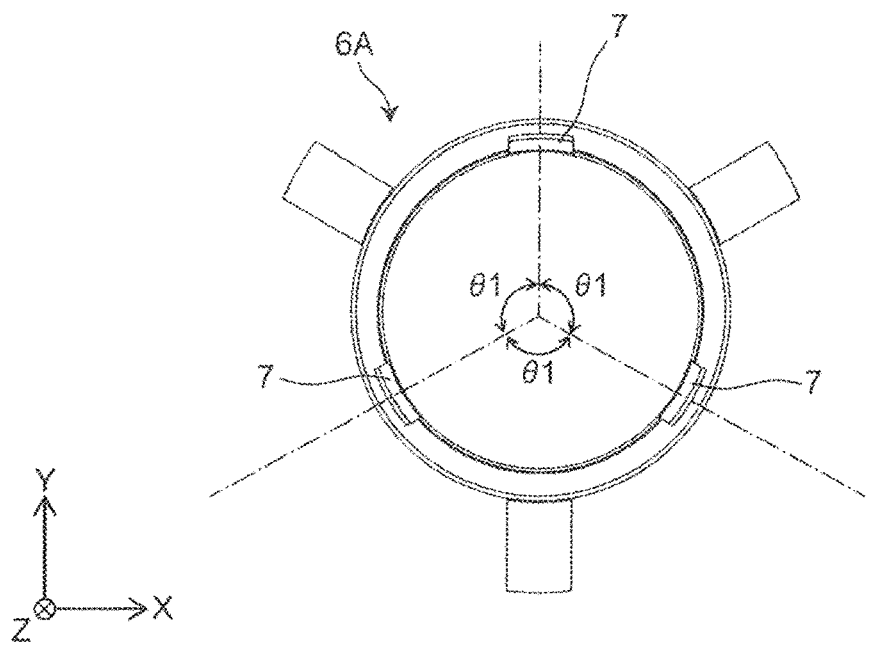
FIG. 15 is a schematic diagram viewed from below of an example of a first power feed conductor in a vibration device of another preferred embodiment of the present invention.
Figure 16:
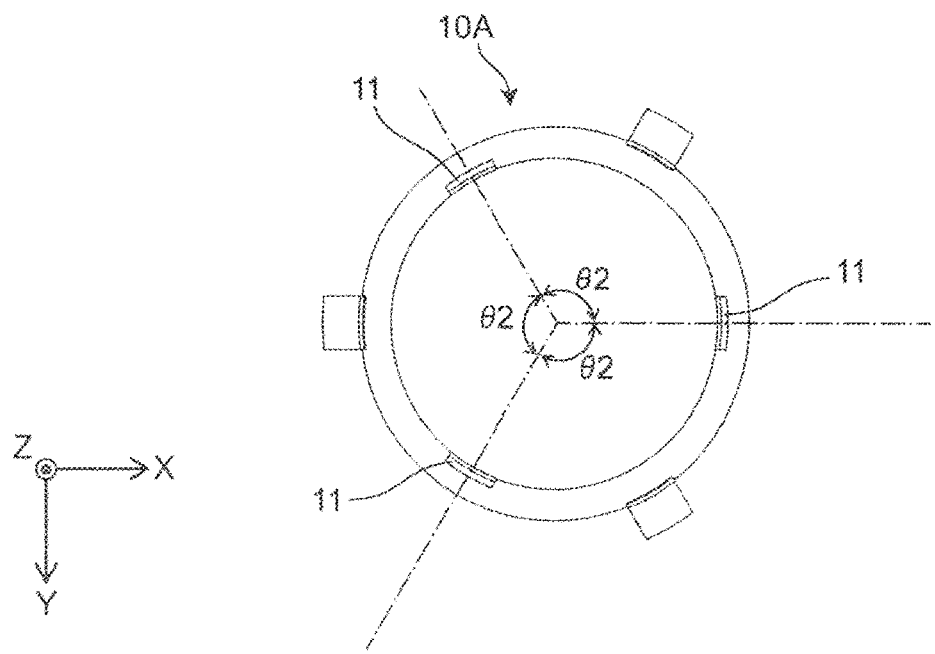
FIG. 16 is a schematic diagram viewed from above of an example of a second power feed conductor in a vibration device of another preferred embodiment of the present invention.

FIG. 15 is a schematic diagram viewed from below of an example of a first power feed conductor 6A in a vibration device according to another preferred embodiment. FIG. 16 is a schematic diagram viewed from above of an example of a second power feed conductor 10A in a vibration device according to another preferred embodiment.

As illustrated in FIG. 15, the first power feed conductor 6A includes three first elastic portions 7. The three first elastic portions 7 are disposed at equal or substantially equal intervals. Specifically, in plan view of the first power feed conductor 6A, when the line segments are drawn from the center of the first power feed conductor 6A toward each of the three first elastic portions 7, the angles θ1 defined by the adjacent line segments are equal or substantially equal to each other. With this configuration, the first power feed conductor 6A may be brought into contact with the piezoelectric element 3 in a well-balanced manner by the three first elastic portions 7. With this, the reliability of the connection between the piezoelectric element 3 and the first power feed conductor 6A may be further increased.

As illustrated in FIG. 16, the second power feed conductor 10A includes three second elastic portions 11. The three second elastic portions 11 are disposed at equal or substantially equal intervals. Specifically, in plan view of the second power feed conductor 10A, when the line segments are drawn from the center of the second power feed conductor 10A toward each of the three second elastic portions 11, the angles θ2 defined by the adjacent line segments are equal or substantially equal to each other. With this configuration, the second power feed conductor 10A is brought into contact with the piezoelectric element 3 in a well-balanced manner by the three second elastic portions 11. With this, the reliability of the connection between the piezoelectric element 3 and the second power feed conductor 10A may be further increased.

Note that the number of the first elastic portions 7 and the number of the second elastic portions 11 are not limited to three. The number of the first elastic portions 7 and the number of the second elastic portions 11 may be four or more. However, from the viewpoint of assembling, the number of the first elastic portions 7 and the number of the second elastic portions 11 are preferably two or more and four or less, for example. More preferably, the number of the first elastic portions 7 and the number of the second elastic portions 11 are two or more and three or less, for example.

Figure 17:
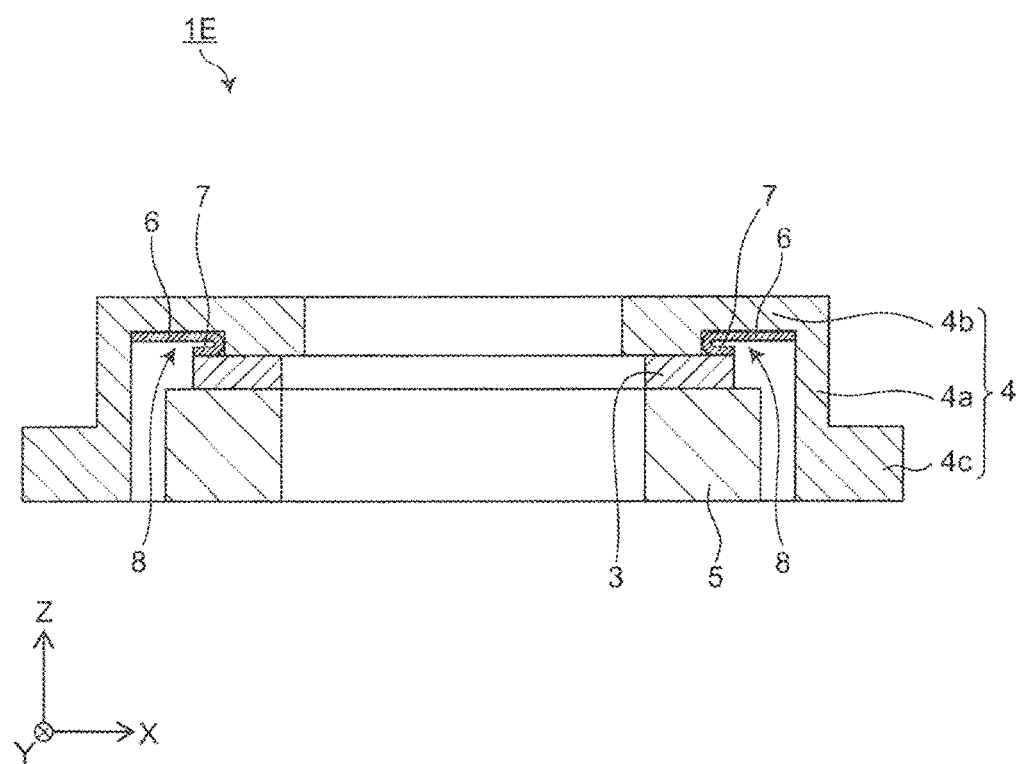
FIG. 17 is a schematic diagram illustrating an example of a configuration of a vibration device of another preferred embodiment of the present invention.

FIG. 17 is a schematic diagram illustrating an example of a configuration of a vibration device 1E according to another preferred embodiment. As illustrated in FIG. 17, the vibration device 1E may not include the light-transmissive cover 2, and may be integrated in another component, a device and/or a system. In other words, the vibration device 1E is not limited to the use in the imaging device 50, and may be applied to various devices.

Preferred embodiments of the present invention have been described in detail with reference to the accompanying drawings. However, various modifications or changes may be apparent to those skilled in the art. It should be understood that such modifications or changes are included in the present invention as long as they do not depart from the scope of the present invention defined by the appended claims.

The vibration devices according to preferred embodiments of the present invention may be applied to a device such as an imaging device, a mobile phone, a digital camera, a mobile terminal device, and a remote controller, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
   a light-transmissive cover;
   a piezoelectric element to vibrate the light-transmissive cover;
   at least one vibration body connected to the piezoelectric element;
   at least one power feed conductor in contact with the piezoelectric element and feeding power to the piezoelectric element; and
   at least one elastic portion pressing the at least one power feed conductor to the piezoelectric element; wherein
   the at least one elastic portion is provided by bending the at least one power feed conductor, and has a plate spring shape provided by curving the at least one power feed conductor.

2. The vibration device according to claim 1, wherein a contact region of the at least one power feed conductor and the piezoelectric element is smaller than a connection region of the at least one vibration body and the piezoelectric element.

3. The vibration device according to claim 2, wherein
   the piezoelectric element includes a first surface and a second surface on a side opposite to the first surface;
   the vibration body is connected to the light-transmissive cover and the first surface of the piezoelectric element;
   the power feed conductor is in contact with the first surface of the piezoelectric element;
   the at least one elastic portion presses the power feed conductor against the first surface of the piezoelectric element; and
   in the first surface of the piezoelectric element:
      an occupation ratio of the connection region is about 70% or more; and
      an occupation ratio of the contact region is about 30% or less.

4. The vibration device according to claim 1, wherein
   the at least one power feed conductor includes an annular portion;
   the at least one elastic portion includes a plurality of elastic portions; and
   the plurality of elastic portions are disposed at equal or substantially equal intervals in the annular portion.

5. The vibration device according to claim 1, wherein
   the at least one vibration body is made of metal; and
   the at least one vibration body is covered with an insulation material.

6. An imaging device comprising:
   the vibration device according to claim 1; and
   an imaging element in the vibration device.

7. The imaging device according to claim 6, wherein a contact region of the at least one power feed conductor and the piezoelectric element is smaller than a connection region of the at least one vibration body and the piezoelectric element.

8. The imaging device according to claim 7, wherein
the piezoelectric element includes a first surface and a second surface on a side opposite to the first surface;
the vibration body is connected to the light-transmissive cover and the first surface of the piezoelectric element;
the power feed conductor is in contact with the first surface of the piezoelectric element;
the at least one elastic portion presses the power feed conductor against the first surface of the piezoelectric element; and
in the first surface of the piezoelectric element:
an occupation ratio of the connection region is about 70% or more; and
an occupation ratio of the contact region is about 30% or less.

9. The imaging device according to claim 6, wherein
the piezoelectric element includes at least one electrode;
the at least one vibration body includes at least one groove to expose the at least one electrode; and
the at least one elastic portion is disposed in the at least one groove.

10. A vibration device comprising:
a light-transmissive cover;
a piezoelectric element to vibrate the light-transmissive cover;
at least one vibration body connected to the piezoelectric element;
at least one power feed conductor in contact with the piezoelectric element and feeding power to the piezoelectric element; and
at least one elastic portion pressing the at least one power feed conductor to the piezoelectric element; wherein
the piezoelectric element includes at least one electrode;
the at least one vibration body includes at least one groove to expose the at least one electrode; and
the at least one elastic portion is disposed in the at least one groove.

11. A vibration device comprising:
a light-transmissive cover;
a piezoelectric element to vibrate the light-transmissive cover;
at least one vibration body connected to the piezoelectric element;
at least one power feed conductor in contact with the piezoelectric element and feeding power to the piezoelectric element; and
at least one elastic portion pressing the at least one power feed conductor to the piezoelectric element; wherein
the piezoelectric element includes a first surface and a second surface on a side opposite to the first surface;
the at least one power feed conductor includes a plurality of power feed conductors;
the at least one elastic portion includes a plurality of elastic portions;
the plurality of power feed conductors include a first power feed conductor in contact with the first surface and a second power feed conductor in contact with the second surface; and
the plurality of elastic portions include at least one first elastic portion to press the first power feed conductor to the first surface and at least one second elastic portion to press the second power feed conductor to the second surface.

12. The vibration device according to claim 11, wherein
the piezoelectric element has an annular shape;
the at least one vibration body includes a plurality of vibration bodies;
the plurality of vibration bodies include a first vibration body connected to a bottom surface of the light-transmissive cover and the first surface of the piezoelectric element and a second vibration body connected to the second surface of the piezoelectric element; and
the second power feed conductor is in contact with the piezoelectric element on an inner peripheral side of the piezoelectric element relative to the first power feed conductor.

13. The vibration device according to claim 12, wherein
in the first surface of the piezoelectric element, a contact region of the first power feed conductor and the piezoelectric element is smaller than a connection region of the first vibration body and the piezoelectric element; and
in the second surface of the piezoelectric element, a contact region of the second power feed conductor and the piezoelectric element is smaller than a connection region of the second vibration body and the piezoelectric element.

14. The vibration device according to claim 12, wherein
the piezoelectric element includes a first electrode provided on the first surface and a second electrode provided on the second surface;
the first vibration body includes at least one first groove to expose the first electrode;
the second vibration body includes at least one second groove to expose the second electrode;
the at least one first elastic portion is disposed in the at least one first groove; and
the at least one second elastic portion is disposed in the at least one second groove.

15. The vibration device according to claim 14, wherein the first power feed conductor includes at least one first support portion extending in a direction intersecting a thickness direction of the piezoelectric element, and the piezoelectric element is held between the at least one first elastic portion and the at least one first support portion.

16. The vibration device according to claim 14, wherein the second power feed conductor includes at least one second support portion extending in a direction intersecting a thickness direction of the piezoelectric element, and the piezoelectric element is held between the at least one second elastic portion and the at least one second support portion.

17. The vibration device according to claim 11, wherein
the at least one first elastic portion include a plurality of first elastic portions;
the at least one second elastic portion include a plurality of second elastic portions; and
the plurality of second elastic portions are disposed between the plurality of first elastic portions.

18. The vibration device according to claim 11, wherein the at least one first elastic portion and the at least one second elastic portion are opposed to each other in a thickness direction of the piezoelectric element.

* * * * *